US010515991B2

(12) United States Patent
Huang et al.

(10) Patent No.: US 10,515,991 B2
(45) Date of Patent: Dec. 24, 2019

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Zen-Fong Huang, Tainan (TW); Volume Chien, Tainan (TW); Su-Hua Chang, Chiayi County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/689,968

(22) Filed: Apr. 17, 2015

(65) Prior Publication Data
US 2016/0307950 A1 Oct. 20, 2016

(51) Int. Cl.
*H01L 27/146* (2006.01)

(52) U.S. Cl.
CPC .. *H01L 27/14621* (2013.01); *H01L 27/14629* (2013.01); *H01L 27/14645* (2013.01); *H01L 27/14649* (2013.01); *H01L 27/14685* (2013.01)

(58) Field of Classification Search
CPC ............ H01L 27/14621; H01L 27/322; H01L 31/02162; H01L 27/146–3297
See application file for complete search history.

(56) References Cited

U.S. PATENT DOCUMENTS

| 8,105,862 | B2 * | 1/2012 | Hiatt | H01L 27/14621 |
| | | | | 438/65 |
| 9,609,239 | B2 * | 3/2017 | Chuang | H04N 5/332 |
| 2008/0055733 | A1 * | 3/2008 | Lim | G02B 5/201 |
| | | | | 359/619 |
| 2011/0260059 | A1 * | 10/2011 | Jiang | H01L 27/1461 |
| | | | | 250/330 |
| 2012/0313206 | A1 * | 12/2012 | Nozaki | H01L 27/14621 |
| | | | | 257/432 |

(Continued)

FOREIGN PATENT DOCUMENTS

| CN | 1579022 A | 2/2005 |
| CN | 103426893 A | 12/2013 |

(Continued)

OTHER PUBLICATIONS

Office Action dated Jul. 5, 2016 of the corresponding Taiwanese application 104138207.

(Continued)

*Primary Examiner* — Shaun M Campbell
*Assistant Examiner* — Suberr L Chi
(74) *Attorney, Agent, or Firm* — WPAT, P.C., Intellectual Property Attorneys; Anthony King

(57) ABSTRACT

A semiconductor structure includes a substrate including a first side and a second side disposed opposite to the first side and configured to receive an electromagnetic radiation, a barrier layer disposed over the second side of the substrate, a color filter disposed over the barrier layer, and a grid surrounding the color filter and disposed over the barrier layer, wherein the barrier layer is configured to absorb or reflect non-visible light in the electromagnetic radiation, and the barrier layer is disposed between the grid and the substrate.

9 Claims, 26 Drawing Sheets

(56) References Cited

U.S. PATENT DOCUMENTS

| | | | | |
|---|---|---|---|---|
| 2013/0119236 A1* | 5/2013 | Lenchenkov | ..... | H01L 27/14643 |
| | | | | 250/208.1 |
| 2013/0134536 A1* | 5/2013 | Mori | ................... | H01L 27/1462 |
| | | | | 257/432 |
| 2013/0307107 A1 | 11/2013 | Tsai et al. | | |
| 2014/0034835 A1* | 2/2014 | Frey | ...................... | G01J 1/0437 |
| | | | | 250/349 |
| 2014/0313379 A1* | 10/2014 | Mackey | ................. | H04N 9/045 |
| | | | | 348/279 |
| 2014/0339606 A1 | 11/2014 | Lin et al. | | |
| 2015/0311239 A1* | 10/2015 | Won | ................. | H01L 27/14621 |
| | | | | 257/432 |

FOREIGN PATENT DOCUMENTS

| | | |
|---|---|---|
| CN | 104425519 A | 3/2015 |
| EP | 1667231 A1 | 6/2006 |
| KR | 20060077084 A | 7/2006 |
| WO | WO 2014/088238  * | 6/2014 |

OTHER PUBLICATIONS

Search report dated Jul. 5, 2016 of the corresponding Taiwanese application 104138207.
Office Action dated Jun. 11, 2018 issued by China Intellectual Property Office for counterpart application 201510770209.0.
English Abstract Translation of KR 20060077084A.
CN1579022A is a family patent to EP1667231A1.
CN103426893A is a family patent with US2013307107A1.
Office Action dated Nov. 16, 2018 issued by China Intellectual Property Office for counterpart application 201510770209.0.

* cited by examiner

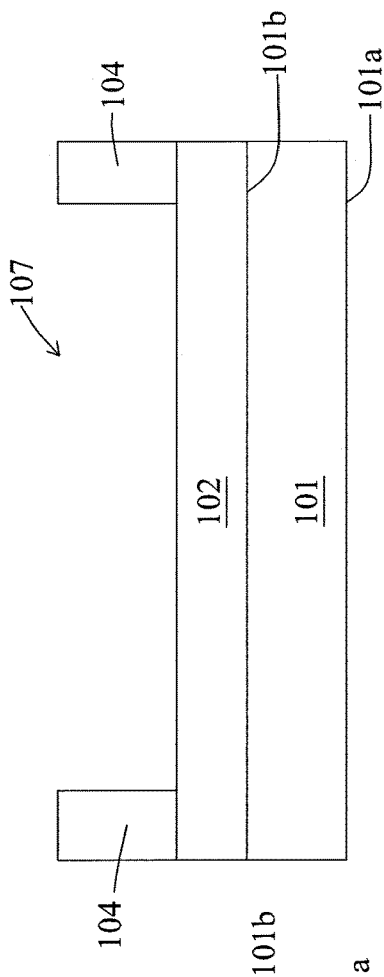

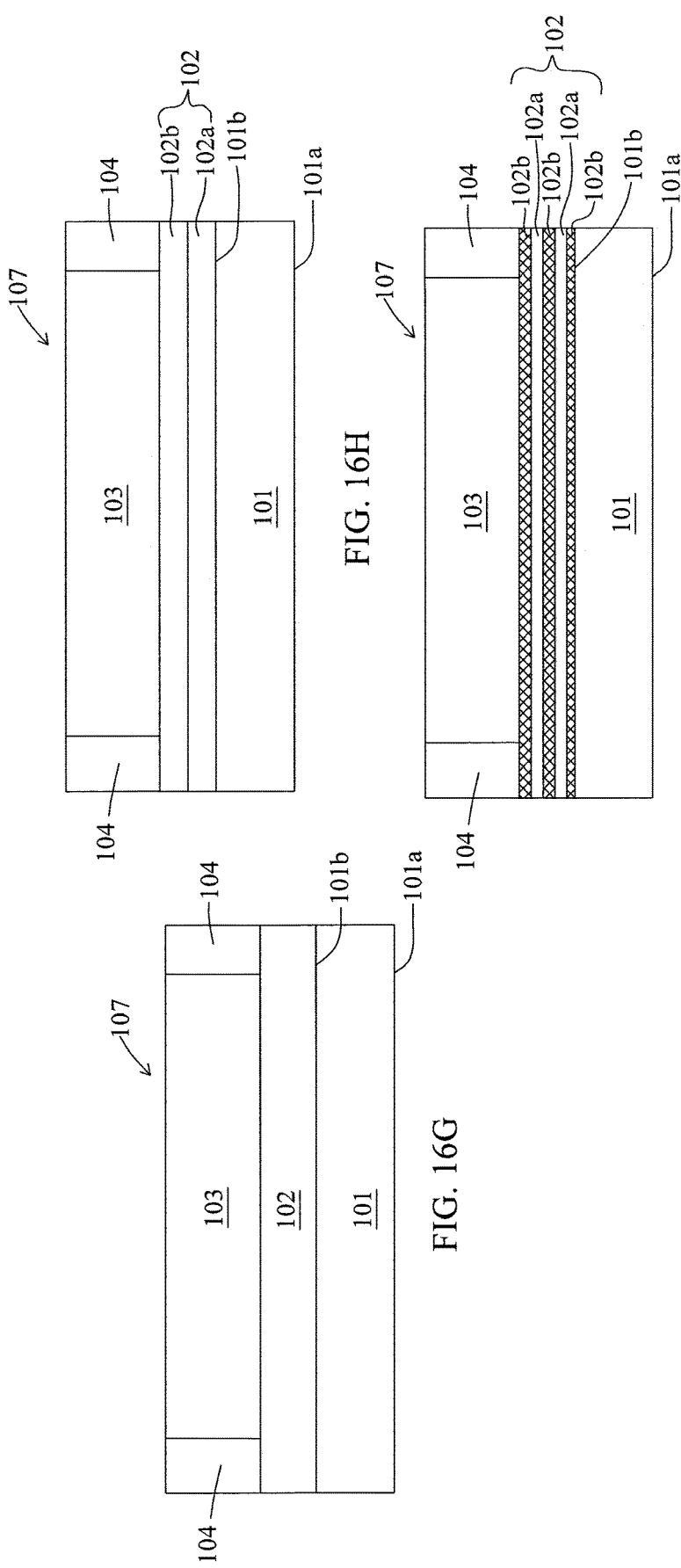

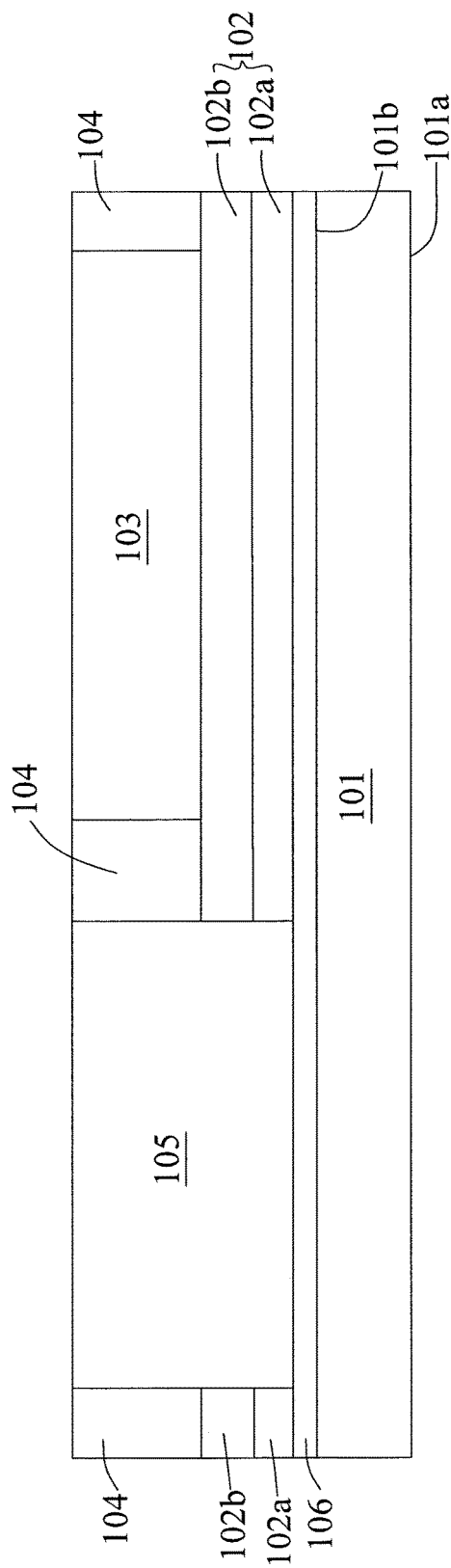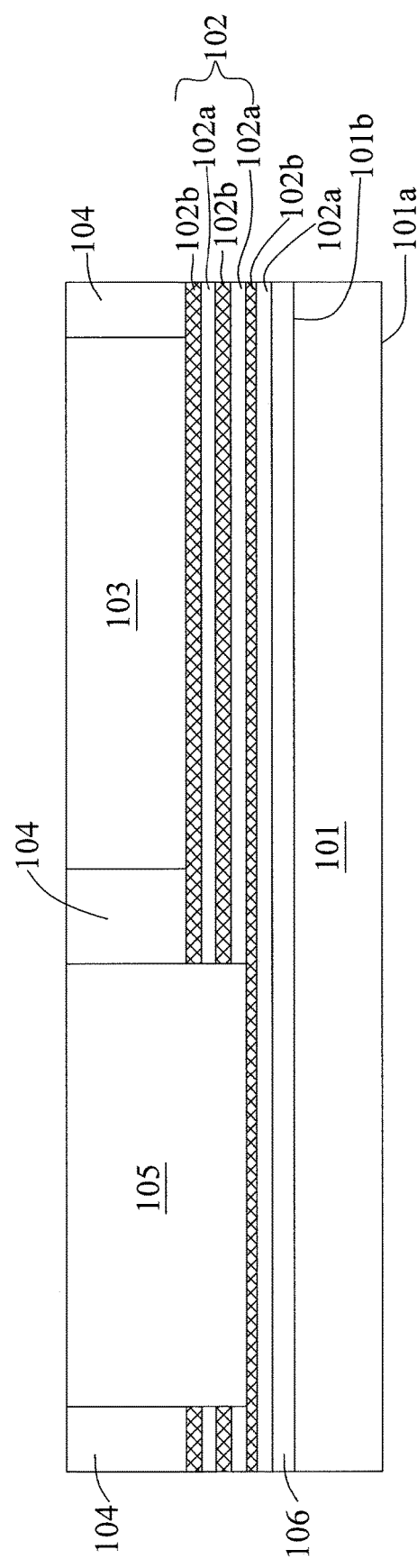
FIG. 17K
FIG. 17L

SEMICONDUCTOR STRUCTURE AND MANUFACTURING METHOD THEREOF

BACKGROUND

Electronic equipment using semiconductor devices are essential for many modern applications. Semiconductor image sensors are commonly involved in electronic equipment for sensing light. Complementary metal-oxide-semiconductor (CMOS) image sensors (CIS) are widely used in various applications, such as digital camera and mobile phone cameras. The CMOS image sensor typically includes an array of picture elements (pixels). Each pixel includes a photo-diode, a transistor or a capacitor. Electrical energy is induced in the photo-diode upon exposure to light. Each pixel generates electrons proportional to the amount of light falling on the pixel. The electrons are converted into a voltage signal in the pixel and further transformed into a digital signal.

CMOS image sensors are classified as front side illuminated (FSI) image sensors and back side illuminated (BSI) image sensors, depending on the light path difference. The BSI image sensors are gaining in popularity. The pixels in the BSI image sensor generate electrical signals in response to incident light. Magnitudes of the electrical signals depend on the intensity of the incident light received by the respective pixels. The light is incident on a back side of a substrate of the BSI image sensor and hits the photo-diode directly, without obstruction from dielectric layers and interconnect layers formed on a front side of the substrate. Such a direct incidence makes the BSI image sensor more sensitive to the light.

However, as technologies evolve, the image sensor is becoming increasingly smaller in size while having greater functionality and greater amounts of integrated circuitry. The manufacturing of the BSI image sensor involves many complicated steps and operations. Since more different components with different materials are involved, complexity of the manufacturing and integration operations of the BSI image sensor is increased. An increase in complexity of manufacturing of the BSI image sensor may cause deficiencies such as poor quantum efficiency (QE), dark current, low full well capacity (FWC), high yield loss, etc. The BSI image sensor is produced in an undesired configuration, which would further exacerbate materials wastage and increase the manufacturing cost.

Therefore, there is a continuous need to modify structure and manufacturing method of the BSI image sensor device in order to improve the performance of the BSI image sensor device as well as reduce cost and time on processing the BSI image sensor.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 16E is a cross-sectional view of a semiconductor structure with a substrate, a barrier layer and a grid in accordance with some embodiments of the present disclosure.

FIG. 16F is a cross-sectional view of a semiconductor structure with a substrate, a barrier layer and a grid with a first recess in accordance with some embodiments of the present disclosure.

FIG. 16G is a cross-sectional view of a semiconductor structure with a substrate, a barrier layer, a grid and a first color filter in accordance with some embodiments of the present disclosure.

FIG. 16H is a cross-sectional view of a semiconductor structure with a substrate, a first dielectric layer, a second dielectric layer, a grid and a first color filter in accordance with some embodiments of the present disclosure.

FIG. 16I is a cross-sectional view of a semiconductor structure with a substrate, several first dielectric layers, several second dielectric layers, a grid and a first color filter in accordance with some embodiments of the present disclosure.

FIG. 17K is a cross-sectional view of a semiconductor structure with a substrate, a first dielectric layer, a second dielectric layer, a grid, a first color filter and a second color filter in accordance with some embodiments of the present disclosure.

FIG. 17L is a cross-sectional view of a semiconductor structure with a substrate, several first dielectric layers, several second dielectric layers, a grid, a first color filter and a second color filter in accordance with some embodiments of the present disclosure.

DETAILED DESCRIPTION OF THE DISCLOSURE

Figure 1:
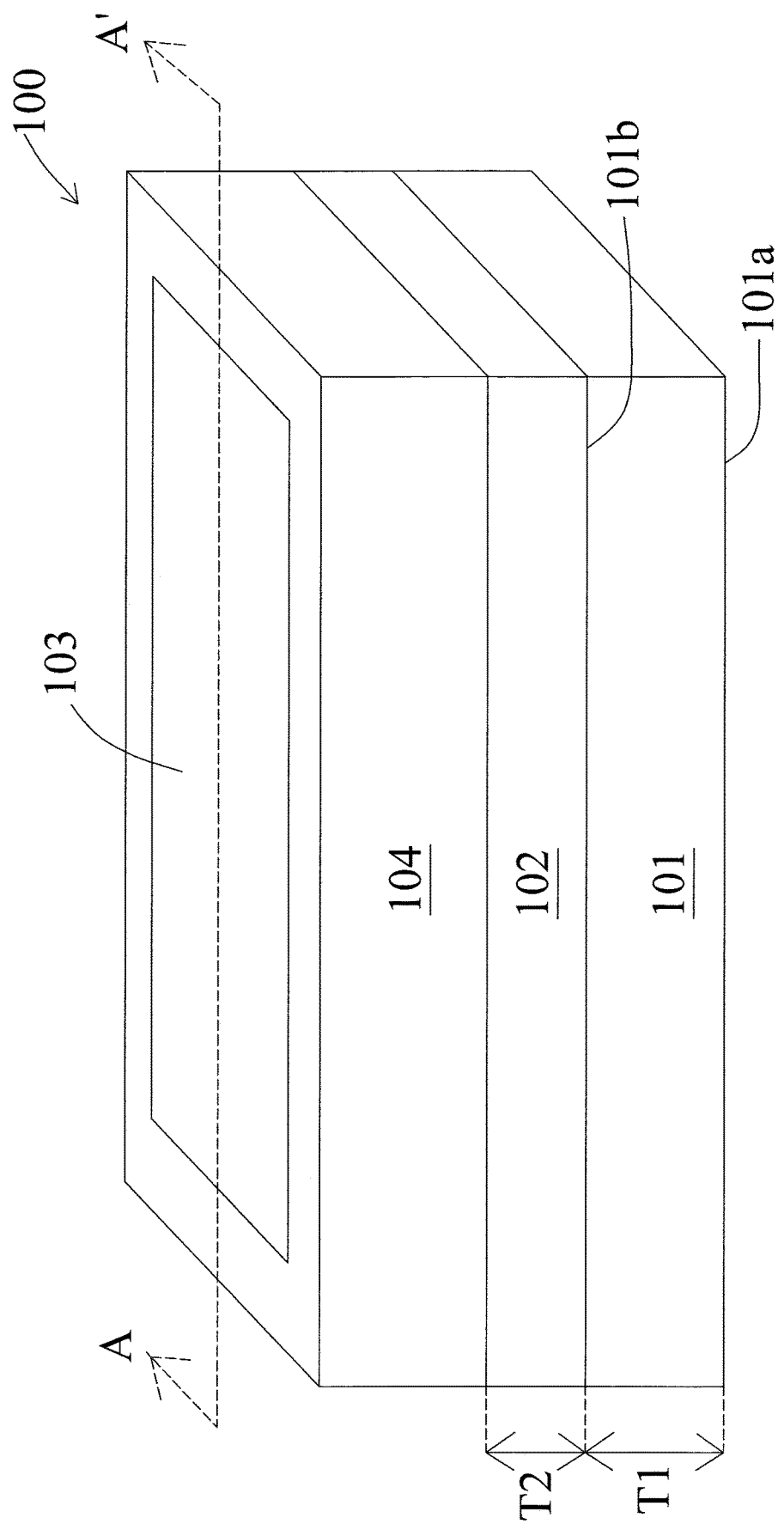
FIG. 1 is a perspective view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A back side illuminated (BSI) image sensing device is used for sensing an electromagnetic radiation of an image and re-construing the image. The BSI image sensing device includes a substrate fabricated for sensing the electromagnetic radiation of the image projected into the device and generating a signal in accordance with the electromagnetic radiation to re-construe the image. A back side of the substrate is configured to receive the incident electromagnetic radiation. The electromagnetic radiation of the image hits a photosensitive diode in the substrate directly, and thus an intensity of the electromagnetic radiation is detected.

Besides the intensity, colors or wavelengths contained in the electromagnetic radiation of the image are also detected. The electromagnetic radiation typically consists of visible light (such as light with colors) and non-visible light (such as infra-red IR, ultra violet UV, etc.). The BSI image sensing device usually detects colors of the visible light in the electromagnetic radiation of the image. The colors of the visible light in the electromagnetic radiation are identified and obtained by color filters. The color filters, disposed over the back side of the substrate, allow visible light in the electromagnetic radiation passing through and impinging on the photosensitive diodes in the substrate. Each color filter allows one of the primary colors (red, green and blue) of the visible light passing through, while other colors would be blocked by the color filter. Thus, only one of the primary colors of the visible light in the electromagnetic radiation would impinge on a corresponding the photosensitive diode disposed under the corresponding color filter.

On the other hand, the non-visible light in the electromagnetic radiation would be cut off by optical lens disposed over the color filters. The non-visible light would be blocked by the optical lens and thus cannot impinge on the color filters and the substrate. Based on such configuration of the BSI image sensing device, however, only the visible light in the incident electromagnetic radiation is obtained. The BSI image sensing device could not sense non-visible light. Besides the colors of the image, other factors such as distance are necessary for re-construing the image. For example, a distance of the image could not be derived accurately by the colors or the intensity of the electromagnetic radiation of the image. Therefore, it is insufficient for re-construing the image only based upon the visible light.

In the present disclosure, an image sensing device with an improved semiconductor structure is disclosed. The semiconductor structure includes a substrate and several color filters. The substrate includes several photosensitive diodes for sensing an electromagnetic radiation of an image. A non-visible light pixel for sensing non-visible light in the electromagnetic radiation is defined in the semiconductor structure. The color filter allows the non-visible light passing through and impinging on the corresponding photosensitive diode, so that the non-visible light can be obtained for subsequent image processing.

In addition, the semiconductor structure is defined with visible light pixel adjacent to the non-visible light pixel. A barrier layer is included in the visible light pixel and disposed between the substrate and the color filter. The barrier layer is configured to absorb or reflect non-visible light such as IR. The barrier layer includes several dielectric layers such as nitride, oxide or carbide. The barrier layer blocks the non-visible light from being incident on the photosensitive diode within the visible light pixel. Therefore, only visible light impinges on the substrate in the visible light pixel.

Figure 2:
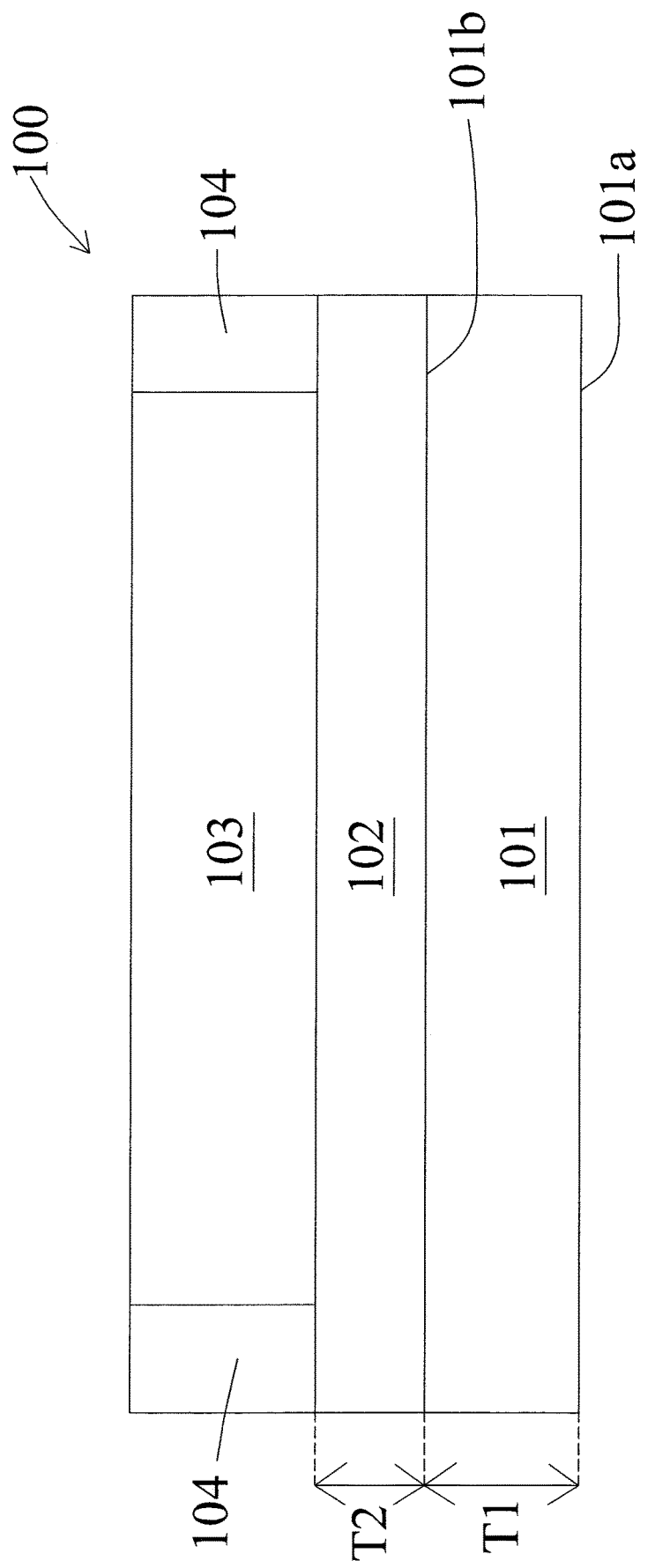
FIG. 2 is a cross-sectional of a semiconductor structure along AA' in FIG. 1 in accordance with some embodiments of the present disclosure.

FIG. 1 is a perspective view of a semiconductor structure 100 in accordance with some embodiments of the present disclosure. FIG. 2 is a cross sectional view of the semiconductor structure 100 along AA' of FIG. 1. In some embodiments, the semiconductor structure 100 is configured to sense an electromagnetic radiation of an image incident on the semiconductor structure 100. In some embodiments, the semiconductor structure 100 includes a substrate 101, a barrier layer 102, a color filter 103 and a grid 104.

In some embodiments, the substrate 101 is a silicon substrate. In some embodiments, the substrate 101 includes silicon, germanium, gallium arsenide or other suitable semiconductive materials. In some embodiments, the substrate 101 is in the form of silicon-on-insulator (SOI), silicon-on-sapphire (SOS), doped and undoped semiconductors, epitaxial layers of silicon supported by a base semiconductor foundation, or other semiconductor structures. In some embodiments, the substrate 101 is a complementary metal-oxide-semiconductor (CMOS) sensor substrate.

In some embodiments, a thickness T1 of the substrate 101 is substantially greater than about 3 um. In some embodiments, the thickness T1 is substantially greater than about 1um. In some embodiments, the substrate 101 is supported by a carrier substrate. In some embodiments, the carrier substrate is temporarily attached to the substrate 101. The carrier substrate would be removed after several operations.

In some embodiments, the substrate 101 includes a first side 101a and a second side 101b opposite to the first side 101a. In some embodiments, the first side 101a is referred to as a front side of the substrate 101, and the second side 101b is referred to as a back side of the substrate 101. In some embodiments, the first side 101a of the substrate 101 is configured to electrically connect with circuitries or interconnect structures in an intermetallic dielectric (IMD) layer. In some embodiments, the second side 101b of the substrate 101 is configured to receive an electromagnetic radiation such as visible light, non-visible light, etc. In some embodiments, the first side 101a of the substrate 101 is attached with the carrier substrate. In some embodiments, the carrier substrate is temporarily attached to the first side 101a and then is removed from the first side 101a after several operations.

In some embodiments, the substrate 101 includes a photosensitive diode. The photosensitive diode is disposed in the substrate 101. In some embodiments, the photosensitive diode is configured to detect the electromagnetic radiation incident on the second side 101b of the substrate 101. The electromagnetic radiation incident on the second side 101b of the substrate 101 induces the photosensitive diode to generate electron-hole pairs in a depletion region of the photosensitive diode. The photosensitive diode is configured to generate an electrical signal in accordance with intensity or brightness of the electromagnetic radiation impinging on the photosensitive diode. In some embodiments, the photosensitive diode is implemented as a pinned layer photodiode including n-type doped region formed in the substrate 101 and heavily doped p-type region formed on a surface of the n-type doped region to form a p-n-p junction.

In some embodiments, the barrier layer 102 is disposed over the second side 101b of the substrate 101. In some embodiments, the substrate 101 is disposed under the barrier layer 102. In some embodiments, the barrier layer 102 is configured to absorb or reflect non-visible light in the electromagnetic radiation. The barrier layer 102 blocks the non-visible light from entering the substrate 101. In some embodiments, the non-visible light includes infra-red (IR), and the IR is absorbed or reflected by the barrier layer 102. Therefore, the IR in the electromagnetic radiation cannot enter the substrate 101 disposed under the barrier layer 102.

In some embodiments, the barrier layer 102 includes dielectric materials. In some embodiments, the barrier layer 102 includes nitride such as silicon nitride. In some embodiments, the barrier layer 102 includes oxide or carbide such as silicon oxide and silicon carbide. In some embodiments, a thickness T2 of the barrier layer 102 is substantially greater than 0.1 um.

In some embodiments, the barrier layer 102 includes a first dielectric layer and a second dielectric layer. In some embodiments, the first dielectric layer includes materials different from the second dielectric layer. In some embodiments, the first dielectric layer and the second dielectric layer are stacked over each other. In some embodiments, the first dielectric layer and the second dielectric layer are extended along the second side 101b of the substrate 101. In some embodiments, the first dielectric layer includes oxide or carbide, while the second dielectric layer includes nitride.

In some embodiments, the color filter 103 is disposed over the barrier layer 102. In some embodiments, the color filter 103 is disposed over the second side 101b of the substrate 101. In some embodiments, the color filter 103 is contacted with the barrier layer 102. In some embodiments, the color filter 103 is configured to filter the electromagnetic radiation in a specific color or wavelength, such as visible light, including red light, green light, blue light, etc. In some embodiments, the color filter 103 is configured to filter visible light. In some embodiments, the color filter 103 is aligned with the photosensitive diode in the substrate 101. Therefore, the photosensitive diode only receives the electromagnetic radiation in the specific color.

In some embodiments, the color filter 103 is configured to allow visible light in the electromagnetic radiation passing through. In some embodiments, the color filter 103 allows one of primary colors (red, green and blue) passing through. For example, the color filter 103 is a red color filter which only allows a red light in the electromagnetic radiation passing through, such that the corresponding photosensitive diode only receives the red light in the electromagnetic radiation. In some embodiments, the color filter 103 would not filter non-visible light such as infra-red (IR) and therefore the non-visible light in the electromagnetic radiation can pass through the color filter 103.

In some embodiments, the color filter 103 includes a dye-based or pigment-based polymer. In some embodiments, the color filter 103 includes a resin or other organic based material having color pigments. In some embodiments, the color filter 103 is optically optimized by optical proximity correction (OPC).

In some embodiments, the grid 104 is disposed over the barrier layer 102 and the second side 101b of the substrate 101. The barrier layer 102 is disposed between the grid 104 and the substrate 101. In some embodiments, the grid 104 is contacted with the barrier layer 102. In some embodiments, the grid 104 surrounds the color filter 103. In some embodiments, the grid 104 is configured to absorb a scattering light of the electromagnetic radiation or reflect the electromagnetic radiation to focus on the corresponding photosensitive diode of the substrate 101. As such, the electromagnetic radiation would not escape from the semiconductor structure 100, and optical cross-talk can be reduced or eliminated.

In some embodiments, the grid 104 is a metal grid including metallic materials such as aluminum, copper, etc. In some embodiments, the grid 104 is an oxide grid including oxide materials. In some embodiments, the grid 104 has a height substantially greater than a height of the color filter 103.

In some embodiments, a micro lens is disposed over the color filter 103. In some embodiments, the micro lens is configured to direct and focus the electromagnetic radiation incident towards the photosensitive diode in the substrate 101. In some embodiments, the micro lens is disposed in various arrangements and in various shapes, depending on a refractive index of a material used for the micro lens and a distance from the photosensitive diode.

Figure 3:
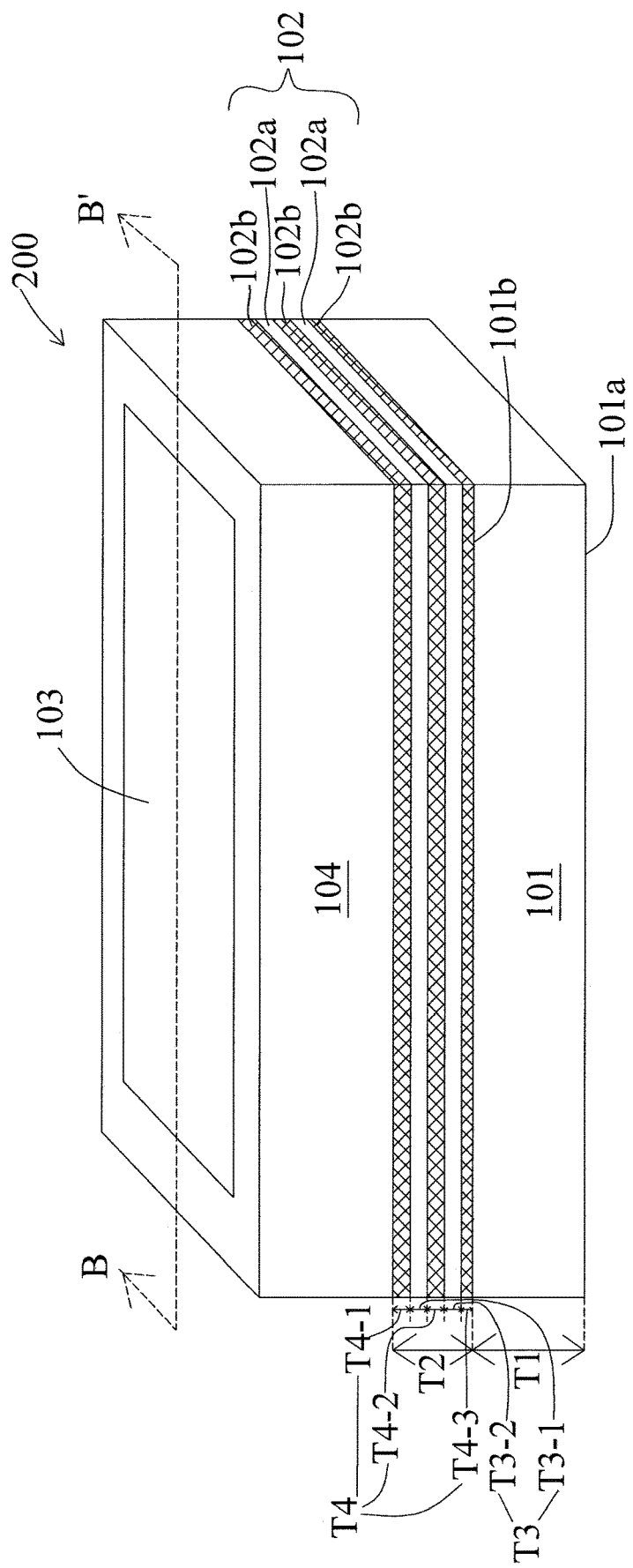
FIG. 3 is a perspective view of a semiconductor structure in accordance with some embodiments of the present disclosure.
Figure 4:
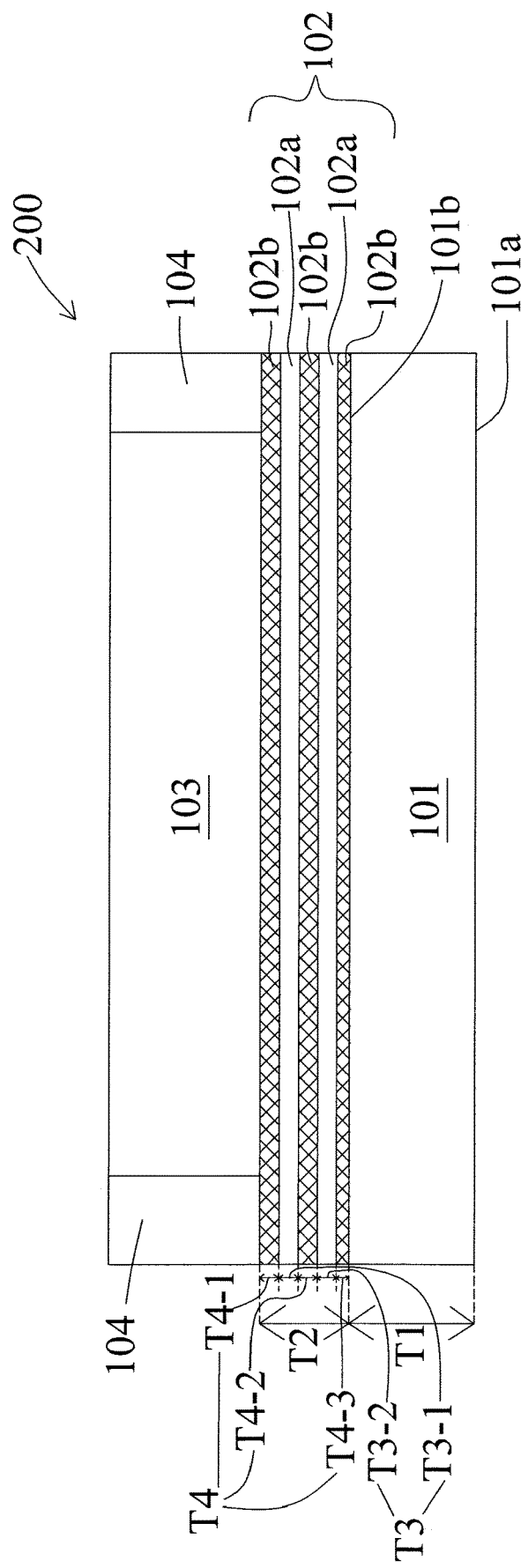
FIG. 4 is a cross-sectional of a semiconductor structure along BB' in FIG. 3 in accordance with some embodiments of the present disclosure.

FIG. 3 is a perspective view of a semiconductor structure 200 in accordance with some embodiments of the present disclosure. FIG. 4 is a cross sectional view of the semiconductor structure 200 along BB' of FIG. 3. In some embodiments, the semiconductor structure 200 is configured to sense an electromagnetic radiation of an image incident on the semiconductor structure 200. In some embodiments, the semiconductor structure 200 includes a substrate 101, a barrier layer 102, a color filter 103 and a grid 104, which have similar configuration as in the semiconductor structure 100 of FIGS. 1 and 2.

In some embodiments, the barrier layer 102 includes several first dielectric layers 102a and several second dielectric layers 102b. For ease of illustration, FIGS. 3 and 4 only show that the barrier layer 102 includes three first dielectric layers 102a and two dielectric layers 102b. However, it is not intended to limit number of layers of the first dielectric layers 102a and the second dielectric layers 102b.

In some embodiments, the first dielectric layers 102a and the second dielectric layers 102b are disposed over a second side 101b of the substrate 101. In some embodiments, the first dielectric layers 102a and the second dielectric layers 102b are stacked over the second side 101b of the substrate 101. In some embodiments, the gird 104 is disposed over the first dielectric layers 102a and the second dielectric layers 102b. In some embodiments, the first dielectric layers 102a and the second dielectric layers 102b are disposed between the grid 104 and the substrate 101.

In some embodiments, the first dielectric layers 102a and the second dielectric layers 102b are disposed alternately. One of the first dielectric layers 102a is interposed between two of the second dielectric layers 102b, or one of the second dielectric layers 102b is interposed between two of the first dielectric layers 102a. In some embodiments, the first dielectric layers 102a are conformal to the second dielectric layers 102b.

In some embodiments, the first dielectric layer 102a includes oxide or carbide, while the second dielectric layer 102b includes nitride. In some embodiments, the first dielectric layer 102a is silicon oxide or silicon carbide, and the second dielectric layer 102b is silicon nitride. In some embodiments, the barrier layer 102 includes at least one second dielectric layer 102b including nitride, so that the barrier layer 102 can absorb or reflect non-visible light such as IR in an electromagnetic radiation incident on the second side 101b of the substrate 101. In some embodiments, the first dielectric layers 102a and the second dielectric layers 102b are cooperated to absorb or reflect the non-visible light in the electromagnetic radiation.

In some embodiments, a thickness T2 of the first dielectric layers 102a and the second dielectric layers 102b is substantially greater than 0.21 um. In some embodiments, a total thickness T3 of the first dielectric layers 102a is substantially greater than 0.06 um. In some embodiments, a total thickness T4 of the second dielectric layers 102b is substantially greater than 0.15 um. In some embodiments, a thickness (T3-1, T3-2 or) of each of the first dielectric layers 102a is substantially greater than 0.03 um. In some embodiments, a thickness (T4-1 or T4-2 or T4-3) of each of the second dielectric layers 102b is substantially greater than 0.05 um.

Figure 5:
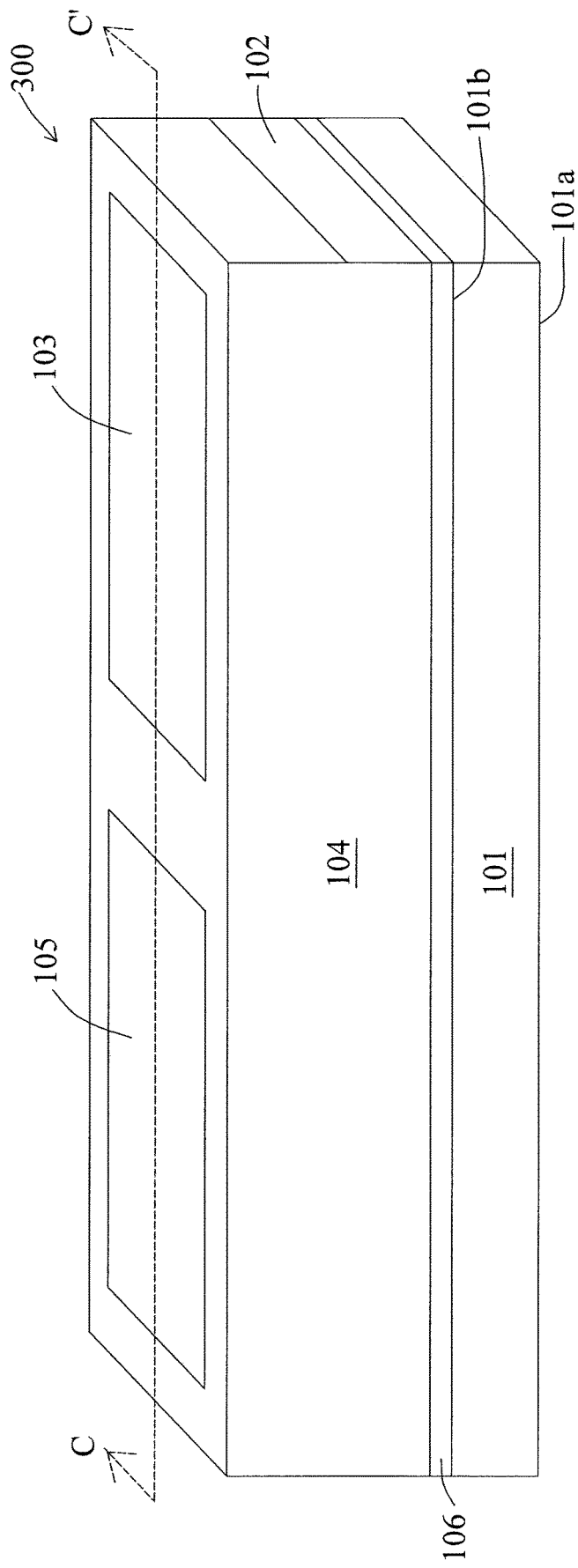
FIG. 5 is a perspective view of a semiconductor structure in accordance with some embodiments of the present disclosure.
Figure 6:
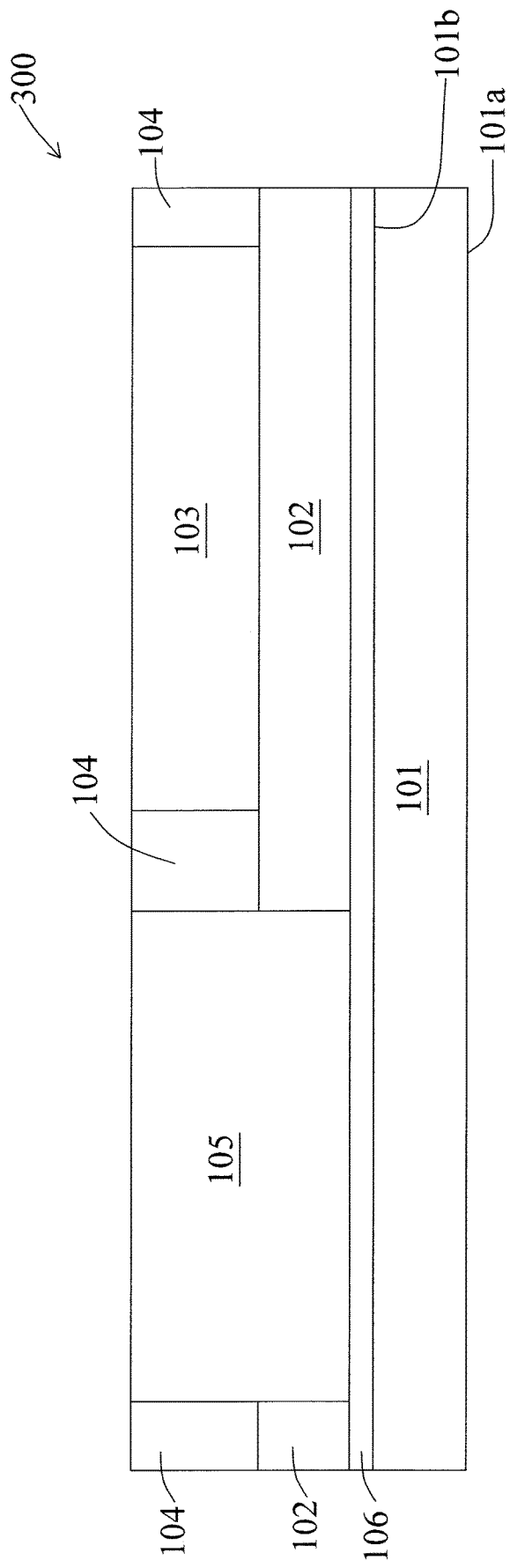
FIG. 6 is a cross-sectional of a semiconductor structure along CC' in FIG. 5 in accordance with some embodiments of the present disclosure.

FIG. 5 is a perspective view of a semiconductor structure 300 in accordance with some embodiments of the present disclosure. FIG. 6 is a cross sectional view of the semiconductor structure 300 along CC' of FIG. 5. In some embodiments, the semiconductor structure 300 is configured to sense an electromagnetic radiation of an image incident on the semiconductor structure 300. In some embodiments, the semiconductor structure 300 includes a substrate 101, a barrier layer 102 and a grid 104, which have similar configuration as in the semiconductor structure 100 of FIGS. 1 and 2.

In some embodiments, the semiconductor structure 300 includes a first color filter 103 and a second color filter 105. In some embodiments, the first color filter 103 has similar configuration as the color filter 103 in the semiconductor structure 100 of FIGS. 1 and 2. The first color filter 103 and the second color filter 105 are disposed over a second side 101b of the substrate 101.

The first color filter 103 is configured to allow visible light in the electromagnetic radiation passing through. In some embodiments, the first color filter 103 allows one of primary colors (red, green and blue) passing through. For example, the first color filter 103 is a red color filter which only allows a red light in the electromagnetic radiation passing through, such that the corresponding photosensitive diode only receives the red light in the electromagnetic radiation. In some embodiments, the first color filter 103 would not filter non-visible light such as infra-red (IR) and therefore the non-visible light in the electromagnetic radiation can pass through the first color filter 103.

In some embodiments, the second color filter 105 is disposed adjacent to the first color filter 103. In some embodiments, the second color filter 105 is disposed over the second side 101b of the substrate 101. In some embodiments, the second color filter 105 is surrounded by the grid 104 and the barrier layer 102. The barrier layer 102 is not present between the substrate 101 and the second color filter 105.

In some embodiments, the second color filter 105 is configured to filter the electromagnetic radiation in a specific wavelength, such as non-visible light, infra-red (IR), etc. In some embodiments, the second color filter 105 is aligned with a photosensitive diode in the substrate 101. Therefore, the photosensitive diode only receives the electromagnetic radiation in the specific wavelength.

In some embodiments, the second color filter 105 is configured to allow non-visible light in the electromagnetic radiation passing through. In some embodiments, the second color filter 105 only allows the IR passing through. The second color filter 105 is an IR filter which only allows the IR in the electromagnetic radiation passing through, such that the corresponding photosensitive diode only receives the IR in the electromagnetic radiation. As the barrier layer 102 for blocking the non-visible light or the IR is absent underneath the second color filter 105, the non-visible light or the IR in the electromagnetic radiation can impinge on the photosensitive diode in the substrate 101.

In some embodiments, the second color filter 105 includes a dye-based or pigment-based polymer. In some embodiments, the second color filter 105 includes a resin or other organic based material having color pigments. In some embodiments, the second color filter 105 is optically optimized by optical proximity correction (OPC). In some embodiments, a micro lens is disposed over the second color filter 105 to direct and focus the electromagnetic radiation incident towards the photosensitive diode in the substrate 101.

In some embodiments, a high dielectric constant (high k) dielectric layer 106 is disposed over a second side 101b of the substrate 101. In some embodiments, a portion of the high k dielectric layer 106 is disposed between the substrate 101 and the barrier layer 102. In some embodiments, a portion of the high k dielectric layer 106 is disposed between the second color filter 105 and the substrate 101. In some embodiments, the high k dielectric layer 106 includes Hafnium(IV) oxide (HfO$_2$), Tantalum pentoxide (Ta$_2$O$_5$) or etc.

Figure 7:
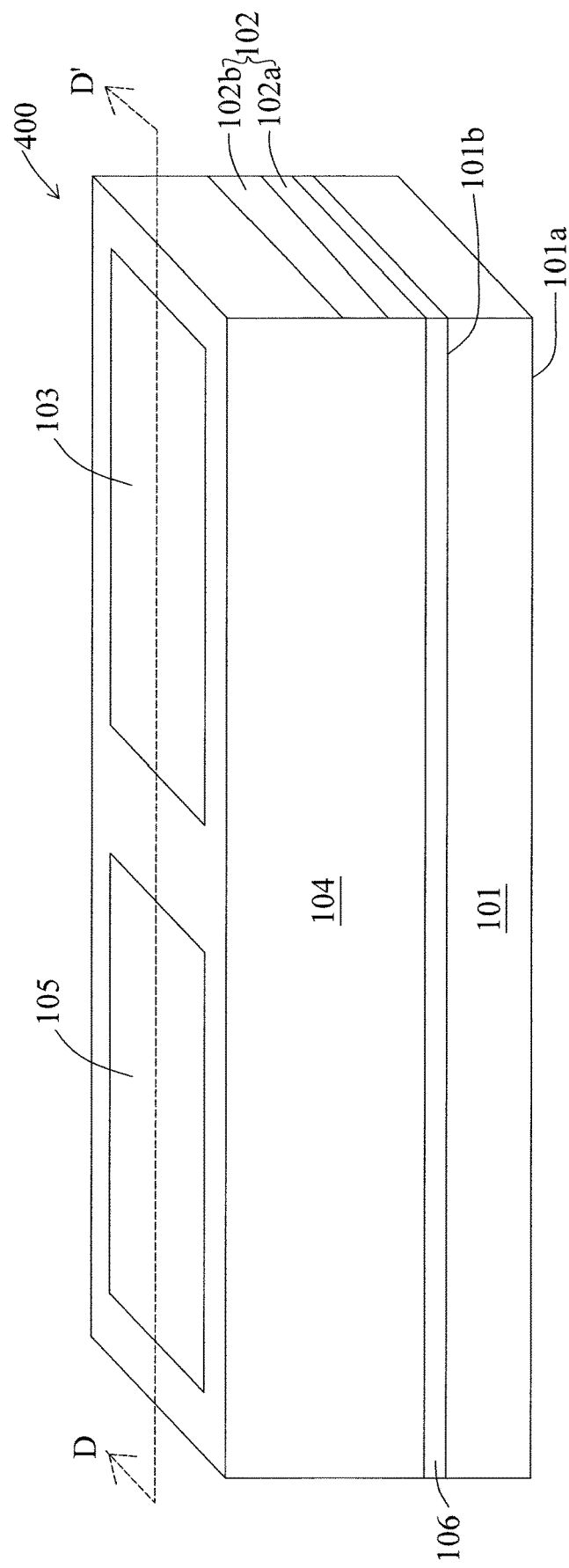
FIG. 7 is a perspective view of a semiconductor structure in accordance with some embodiments of the present disclosure.
Figure 8:
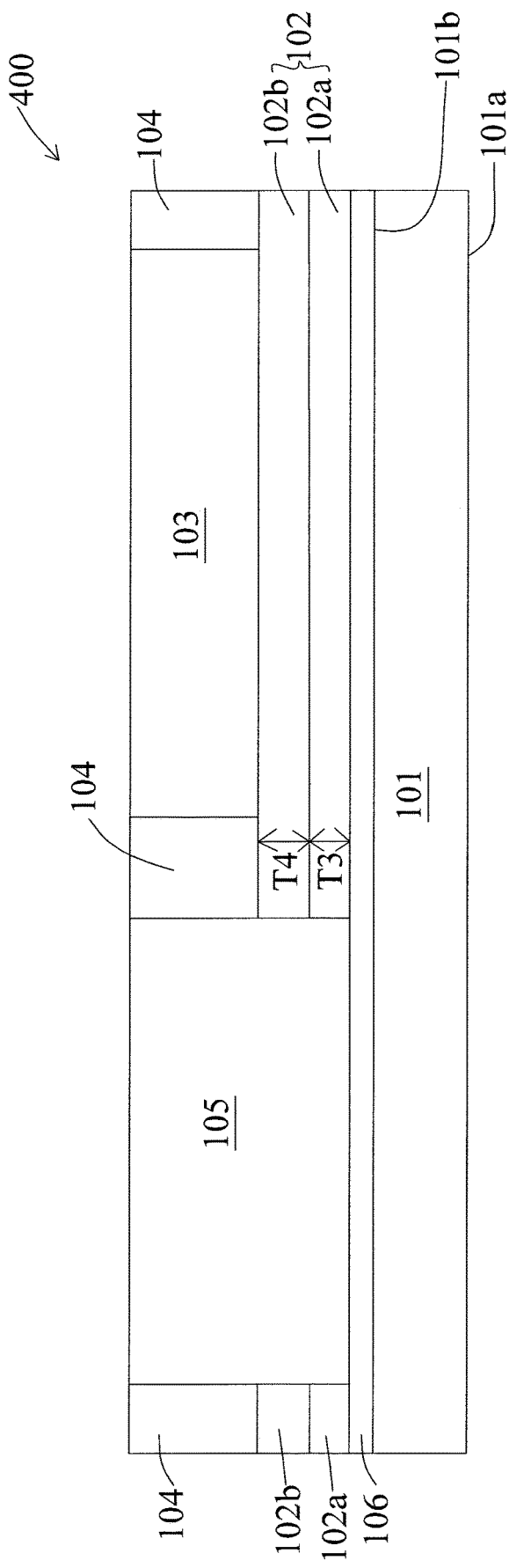
FIG. 8 is a cross-sectional of a semiconductor structure along DD' in FIG. 7 in accordance with some embodiments of the present disclosure.

FIG. 7 is a perspective view of a semiconductor structure 400 in accordance with some embodiments of the present disclosure. FIG. 8 is a cross sectional view of the semiconductor structure 400 along DD' of FIG. 7. In some embodiments, the semiconductor structure 400 is configured to sense an electromagnetic radiation of an image incident on the semiconductor structure 400. In some embodiments, the semiconductor structure 400 includes a substrate 101, a barrier layer 102, a first color filter 103, a second color filter 105 and a grid 104, which have similar configuration as in the semiconductor structure 300 of FIGS. 5 and 6.

In some embodiments, the substrate 101 includes a first side 101a and a second side 101b disposed opposite to the first side 101a. The second side 101b is configured to receive the electromagnetic radiation. In some embodiments, the barrier layer 102 includes a first dielectric layer 102a and a second dielectric layer 102b. The first dielectric layer 102a and the second dielectric layer 102b are disposed over the second side 101b of the substrate 101. In some embodiments, the second dielectric layer 102b is disposed over the first dielectric layer 102a. In some embodiments, the first dielectric layer 102a is disposed over the second dielectric layer 102b.

In some embodiments, the first electric layer 102a includes oxide or carbide, and the second dielectric layer 102b includes nitride. In some embodiments, a thickness T3 of the first dielectric layer 102a is substantially greater than about 0.06 um. In some embodiments, a thickness T4 of the second dielectric layer 102b is substantially greater than about 0.15 um.

In some embodiments, the first color filter 103 is disposed over the second side 101b of the substrate 101 and is configured to allow visible light in the electromagnetic radiation passing through. In some embodiments, the first color filter 103 would not filter non-visible light such as infra-red (IR) and therefore the non-visible light in the electromagnetic radiation can pass through the first color filter 103. In some embodiments, the first dielectric layer 102a and the second dielectric layer 102b are disposed between the first color filter 103 and the substrate 101. In some embodiments, the first dielectric layer 102a and the second dielectric layer 102b are configured to absorb or reflect non-visible light or IR in the electromagnetic radiation passed through the first color filter 103.

In some embodiments, the second color filter 105 is disposed over the second side 101b of the substrate 101 and configured to allow non-visible light or infra-red (IR) in the electromagnetic radiation passing through. In some embodiments, the non-visible light or IR in the electromagnetic radiation passes through the second color filter 105 and impinges on the substrate 101. In some embodiments, the second color filter 105 is surrounded by the first dielectric layer 102a and the second dielectric layer 102b. As the first dielectric layer 102a and the second dielectric layer 102b are absent underneath the second color filter 105, the non-visible light or IR can pass through the second color filter 105 and impinge the substrate 101.

In some embodiments, the grid 104 is disposed over the first dielectric layer 102a and the second dielectric layer 102b. In some embodiments, the grid 104 separates the first color filter 103 from the second color filter 105. The grid 104 surrounds the first color filter 103 and the second color filter 105.

In some embodiments, a high dielectric constant (high k) dielectric layer 106 is disposed over a second side 101b of the substrate 101. In some embodiments, a portion of the high k dielectric layer 106 is disposed between the substrate 101 and the first dielectric layer 102a or the second dielectric layer 102b. In some embodiments, a portion of the high k dielectric layer 106 is disposed between the second color filter 105 and the substrate 101.

Figure 9:
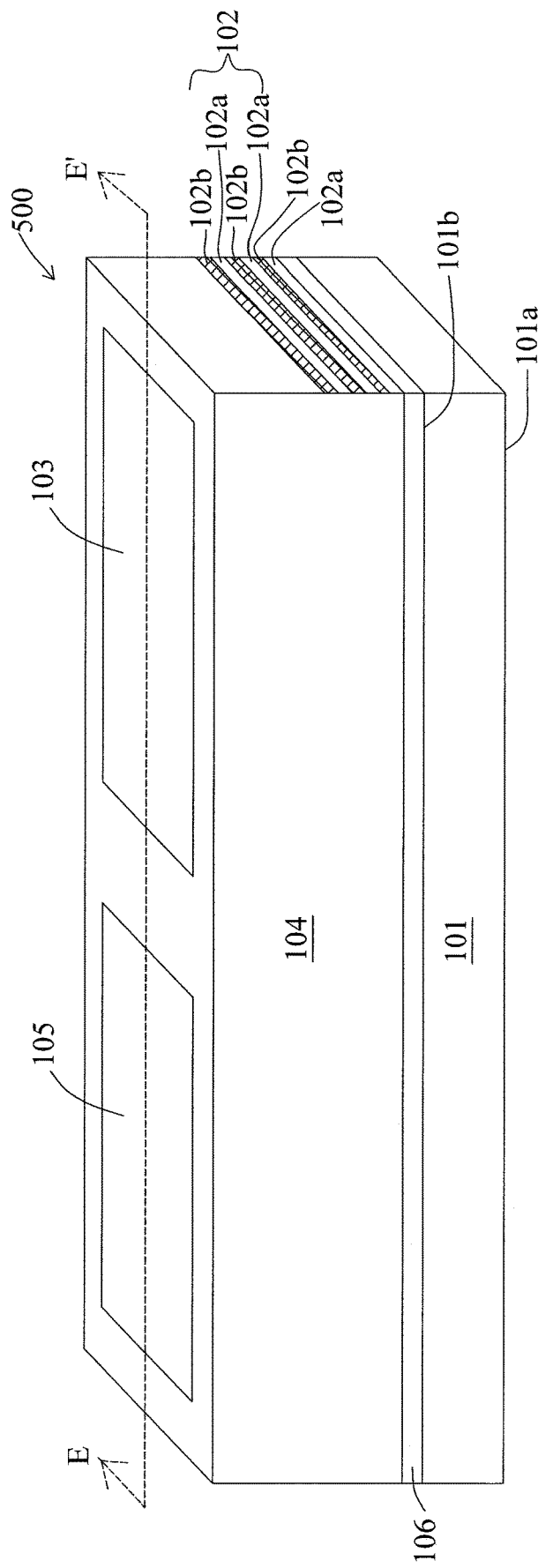
FIG. 9 is a perspective view of a semiconductor structure in accordance with some embodiments of the present disclosure.
Figure 10:
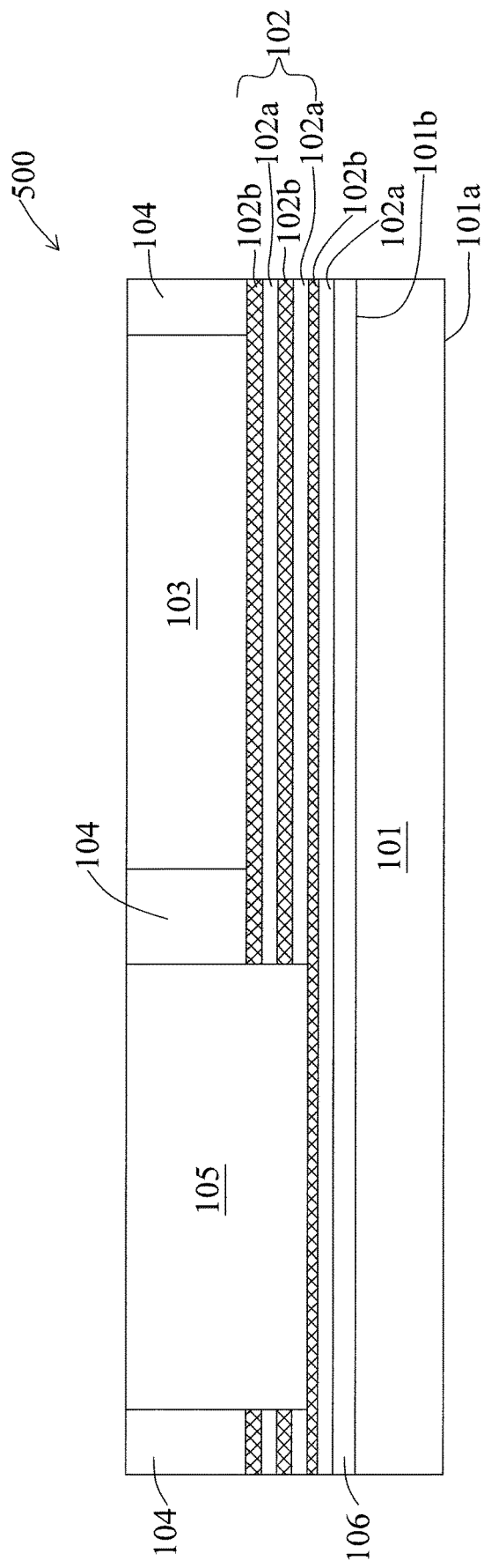
FIG. 10 is a cross-sectional of a semiconductor structure along EE' in FIG. 9 in accordance with some embodiments of the present disclosure.

FIG. 9 is a perspective view of a semiconductor structure 500 in accordance with some embodiments of the present disclosure. FIG. 10 is a cross sectional view of the semiconductor structure 500 along EE' of FIG. 9. In some embodiments, the semiconductor structure 500 is configured to sense an electromagnetic radiation of an image incident on the semiconductor structure 500. In some embodiments, the semiconductor structure 500 includes a substrate 101, a first color filter 103, a second color filter 105 and a grid 104, which have similar configuration as in the semiconductor structure 400 of FIGS. 7 and 8.

In some embodiments, the semiconductor structure 500 includes several first dielectric layers 102a and several second dielectric layers 102b. In some embodiments, the first dielectric layer 102a includes oxide or carbide such as silicon oxide, silicon carbide or etc. In some embodiments, the second dielectric layer 102b includes nitride such as silicon nitride or etc.

In some embodiments, one or more of the first dielectric layers 102a is/are disposed between the substrate 101, the first color filter 103 and the second color filter 105. In some embodiments, one or more of the second dielectric layers 102*b* is/are disposed between the substrate 101, the first color filter 103 and the second color filter 105. In some embodiments, the first color filter 103 is contacted with one of the first dielectric layers 102*a* or one of the second dielectric layers 102*b*. In some embodiments, the second color filter 105 is contacted with one of the first dielectric layers 102*a* or one of the second dielectric layers 102*b*.

In some embodiments, a number of the first dielectric layers 102*a* and a number of the second dielectric layers 102*b* disposed between the second color filter 105 and the substrate 101 are insufficient to absorb or reflect non-visible light or IR in the electromagnetic radiation. Therefore, the non-visible light or IR can pass through the number of the first dielectric layers 102*a* and the number of the second dielectric layers 102*b* and can impinge on the substrate 101.

In some embodiments, one or more of the first dielectric layers 102*a* and one or more of the second dielectric layers 102*b* are configured as a barrier layer 102 and surround the second color filter 105. In some embodiments, the barrier layer 102 includes a number of the first dielectric layers 102*a* and a number of the second dielectric layers 102*b* which are sufficient to absorb or reflect non-visible light or IR in the electromagnetic radiation. As such, non-visible light or IR can be blocked by the barrier layer 102 and cannot enter the substrate 101. In some embodiments, the number of the first dielectric layers 102*a* and the number of the second dielectric layers 102*b* (the barrier layer 102) are disposed between the first color filter 103 and the substrate 101. Thus, the non-visible light or IR in the electromagnetic radiation is blocked and cannot enter the substrate 101.

In some embodiments, the barrier layer 102 includes several first dielectric layers 102*a* and several second dielectric layers 102*b* which are disposed between the first color filter 103 and the substrate 101. The first dielectric layers 102*a* and the second dielectric layers 102*b* are configured to absorb or reflect the non-visible light or IR in the electromagnetic radiation. In some embodiments, the first dielectric layers 102*a* and the second dielectric layers 102*b* are alternately disposed over the second side 101*b* of the substrate 101. The first dielectric layers 102*a* and the second dielectric layers 102*b* are stacked over each other. In some embodiments, the first dielectric layers 102*a* and the second dielectric layers 102*b* surround the second color filter 105.

Figure 11:
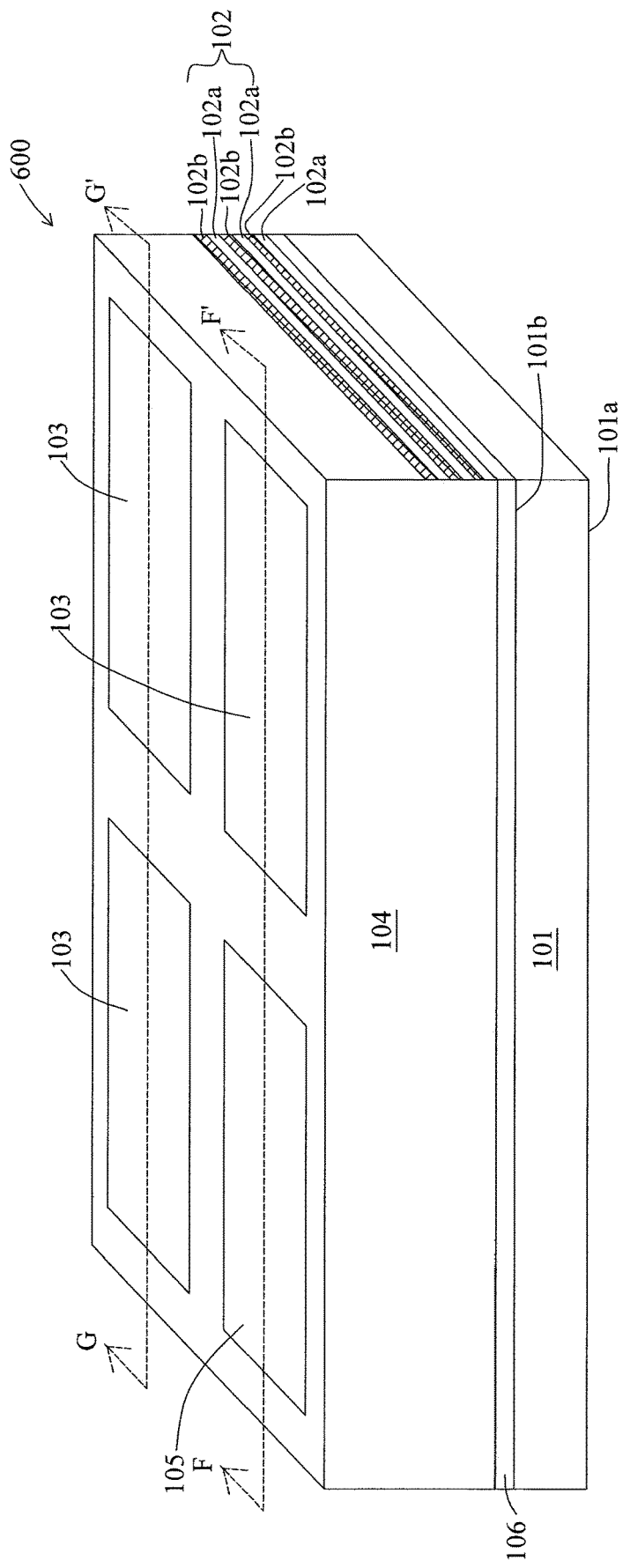
FIG. 11 is a perspective view of a semiconductor structure in accordance with some embodiments of the present disclosure.
Figure 12:
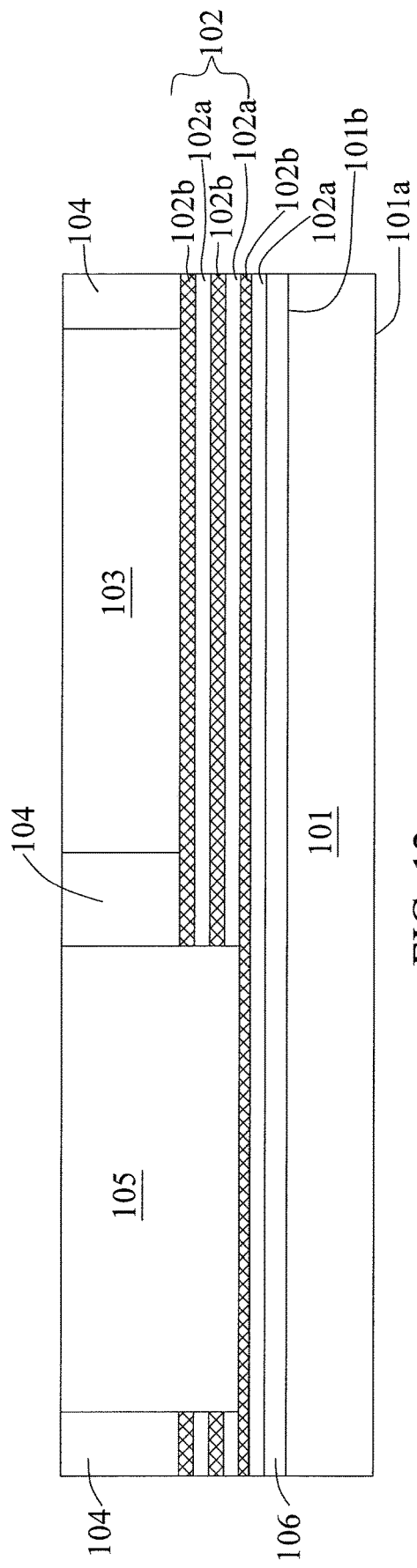
FIG. 12 is a cross-sectional of a semiconductor structure along FF' in FIG. 11 in accordance with some embodiments of the present disclosure.
Figure 13:
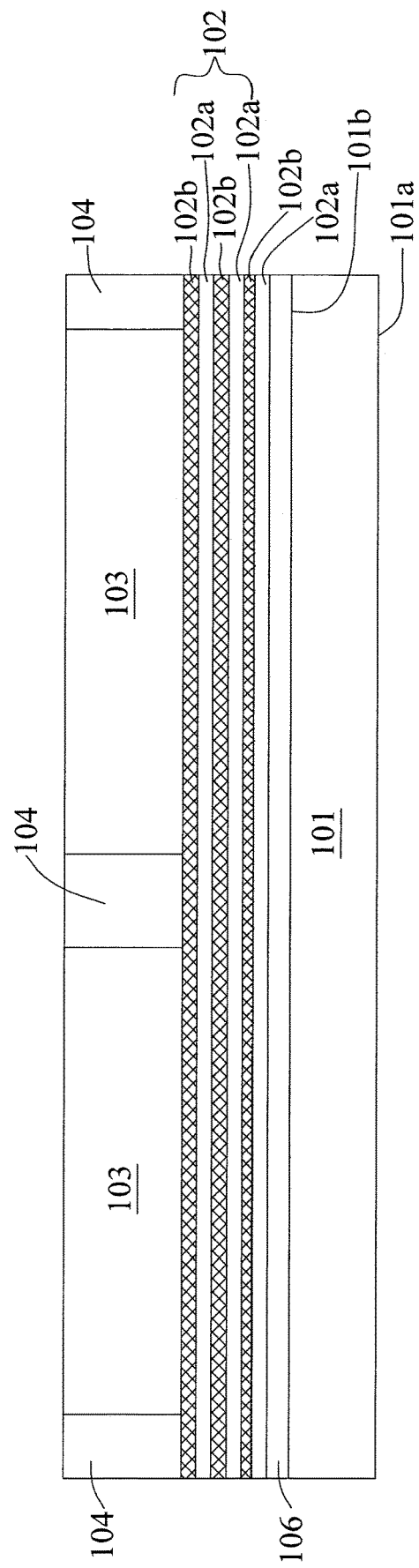
FIG. 13 is a cross-sectional of a semiconductor structure along GG' in FIG. 11 in accordance with some embodiments of the present disclosure.

FIG. 11 is a perspective view of a semiconductor structure 600 in accordance with some embodiments of the present disclosure. FIG. 12 is a cross sectional view of the semiconductor structure 600 along FF' of FIG. 11. FIG. 13 is a cross sectional view of the semiconductor structure 600 along GG' of FIG. 11. In some embodiments, the semiconductor structure 600 is configured to sense an electromagnetic radiation of an image incident on the semiconductor structure 600. In some embodiments, the semiconductor structure 600 includes a substrate 101, a barrier layer 102 and a grid 104, which have similar configuration as the semiconductor structure 500 in FIGS. 9 and 10.

In some embodiments, the semiconductor structure 600 includes several first color filters 103 disposed over the barrier layer 102. Each of the first color filters 103 has similar configuration as the first color filter 103 in semiconductor structure 100 of FIGS. 1 and 2. In some embodiments, the first color filters 103 are configured to filter visible light. For example, one of the first color filters 103 is a white light filter which only allows white visible light passing through. In some embodiments, the first color filters 103 are configured to filter one of primary colors (red, green and blue). For example, one of the first color filters 103 is a red filter which only allows the red light passing through, or one of the first color filters 103 is a green filter which only allows green light passing through, or one of the first color filters 103 is a blue filter which only allows the blue light passing through.

In some embodiments, the first color filters 103 would not filter non-visible light such as infra-red (IR) and therefore the non-visible light in the electromagnetic radiation can pass through the first color filters 103. As the barrier layer 102 is disposed between the first color filters 103 and the substrate 101, the non-visible light or IR in the electromagnetic radiation passed through the first color filters 103 is absorbed or reflected by the barrier layer 102, and thus cannot impinge on the substrate 101.

In some embodiments, the semiconductor structure 600 includes one or more second color filters 105. The second color filters 105 has similar configuration as the second color filter 105 in semiconductor structure 300 of FIGS. 5 and 6. In some embodiments, the second color filter 105 is disposed adjacent to one of the first color filters 103. In some embodiments, the first color filters 103 and the second color filter 105 are disposed in an array manner. In some embodiments, the first color filters 103 and the second color filter 105 are isolated from each other by the grid 104.

In some embodiments, the second color filter 105 is configured to filter the non-visible light or IR. In some embodiments, the second color filter 105 only allows IR passing through and impinging on the substrate 101. As the barrier layer 102 is not present between the second color filter 105 and the substrate 101, IR passed through the second color filter 105 can impinge on the substrate 101.

Figure 14:
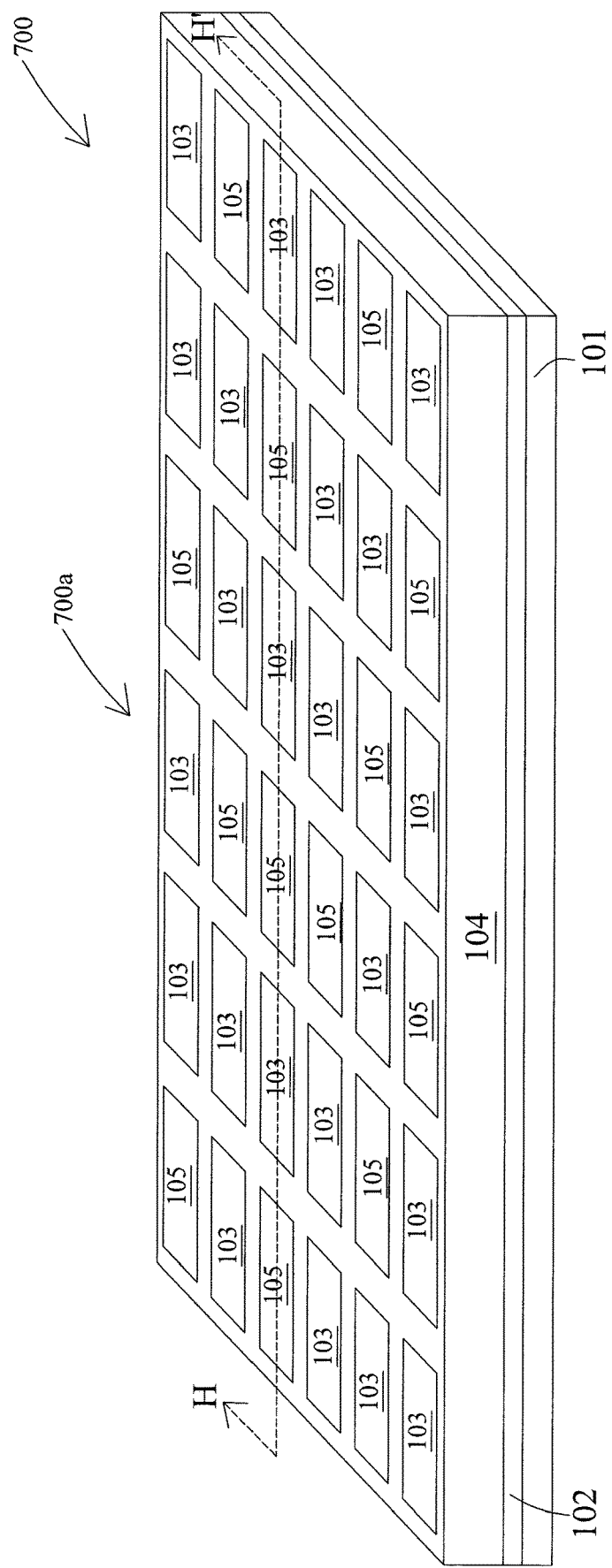
FIG. 14 is a perspective view of an image sensing device in accordance with some embodiments of the present disclosure.
Figure 15:
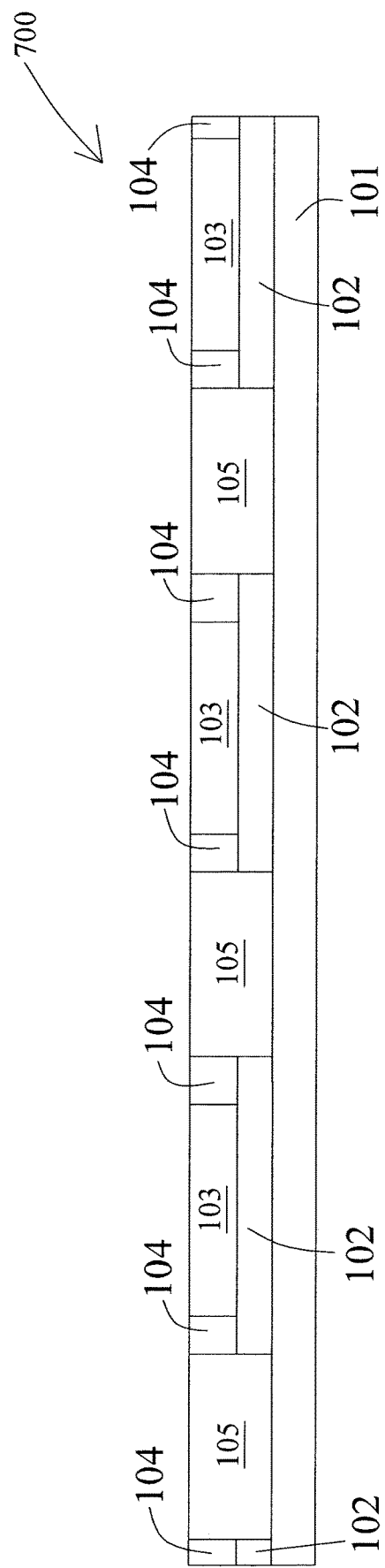
FIG. 15 is a cross-sectional of an image sensing device along HH' in FIG. 14 in accordance with some embodiments of the present disclosure.

FIG. 14 is a perspective view of an image sensing device 700 in accordance with some embodiments of the present disclosure. FIG. 15 is a cross sectional view of the image sensing device 700 along HH' of FIG. 14. The image sensing device 700 includes several semiconductor structures which have similar configuration as any one of the semiconductor structures (100, 200, 300, 400, 500 or 600) as in any one of FIGS. 1-13. The image sensing device 700 is configured to sense an electromagnetic radiation of an image incident on a back side 700*a* of the image sensing device 700. In some embodiments, the image sensing device 700 includes a substrate 101, a barrier layer 102, several first color filters 103, several second color filters 105 and a grid 104, which have similar configuration as any one of the semiconductor structures (100, 200, 300, 400, 500 or 600) as in any one of FIGS. 1-13.

In some embodiments, the first color filters 103 and the second color filters 105 are arranged in an array manner. The first color filters 103 are configured to filter visible light in the electromagnetic radiation, and the second color filters 105 are configured to filter non-visible light in the electromagnetic radiation. In some embodiments, each of the first color filters 103 allows one of primary colors (red, green and blue) in the electromagnetic radiation passing through and impinging on corresponding photosensitive diodes in the substrates 101, and each of the second color filters allows infra-red (IR) in the electromagnetic radiation passing through and impinging on corresponding photosensitive diodes in the substrates 101. Therefore, both visible light and non-visible light in the electromagnetic radiation can be received by corresponding photosensitive diodes in the substrate 101 of the image sensing device 700. In some embodiments, red light, green light, blue light and IR are received by the image sensing device 700. Since both visible light and non-visible light in the electromagnetic radiation are received, accuracy of reconstruction of an image can be improved.

In the present disclosure, a method of manufacturing a semiconductor structure is also disclosed. In some embodiments, a semiconductor structure is formed by a method 800. The method 800 includes a number of operations and the description and illustration are not deemed as a limitation as the sequence of the operations.

Figure 16:
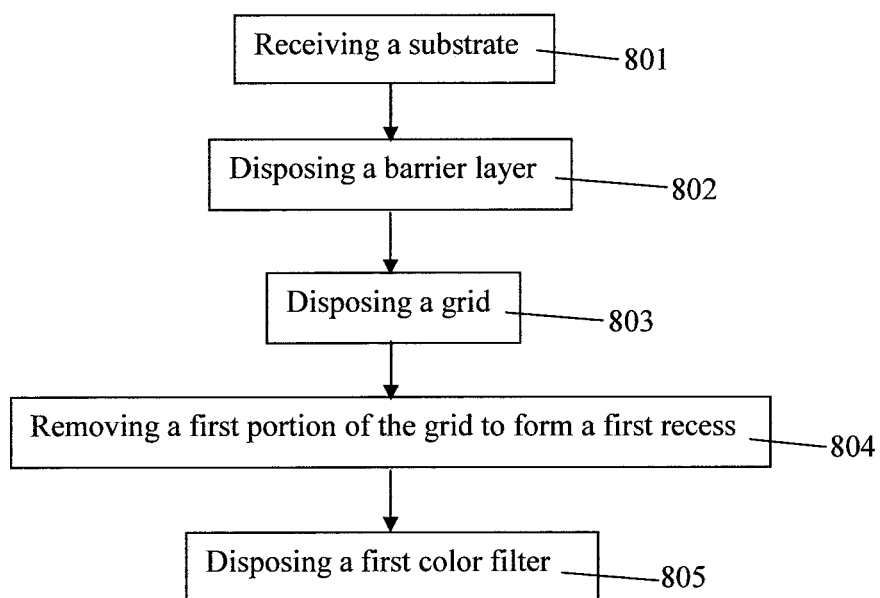
FIG. 16 is a flow diagram of a method of manufacturing a semiconductor structure in accordance with some embodiments of the present disclosure.

FIG. 16 is an embodiment of a method 800 of manufacturing a semiconductor structure. The method 800 includes a number of operations (801, 802, 803, 804 and 805).

Figure 16C:
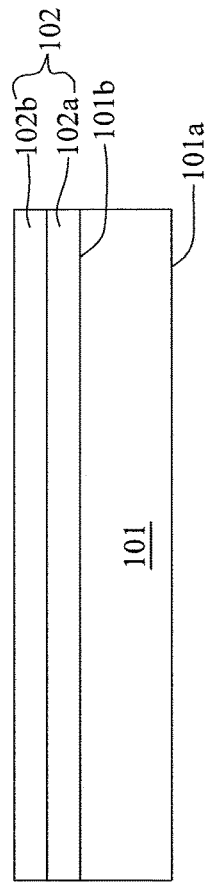
FIG. 16C is a cross-sectional view of a semiconductor structure with a substrate, a first dielectric layer and a second dielectric layer in accordance with some embodiments of the present disclosure.
Figure 16D:
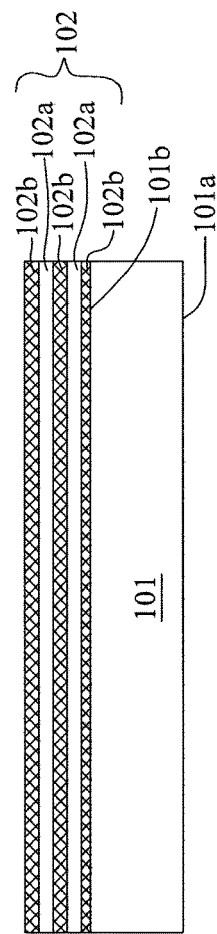
FIG. 16D is a cross-sectional view of a semiconductor structure with a substrate, several first dielectric layers and several second dielectric layers in accordance with some embodiments of the present disclosure.
Figure 16A:
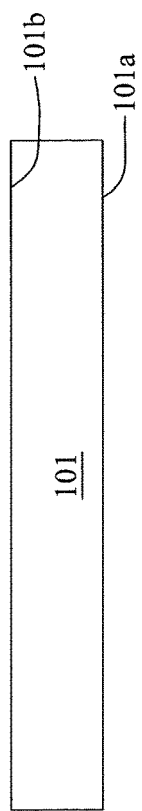
FIG. 16A is a cross-sectional view of a semiconductor structure with a substrate in accordance with some embodiments of the present disclosure.

In operation 801, a substrate 101 is received or provided as shown in FIG. 16A. In some embodiments, the substrate 101 is a silicon substrate. In some embodiments, substrate 101 has similar configuration as the substrate 101 in the semiconductor structure 100 of FIGS. 1 and 2. In some embodiments, the substrate 101 includes a first side 101a and a second side 101b opposite to the first side 101a. In some embodiments, several photosensitive diodes are formed in the substrate 101.

In some embodiments, an intermetallic dielectric (IMD) is disposed over the first side 101a of the substrate 101. In some embodiments, an interconnect structure is disposed within the IMD. In some embodiments, a carrier substrate is disposed over the first side 101a of the substrate 101. In some embodiments, the carrier substrate is attached to the IMD or the first side 101a. The second side 101b of the substrate 101 is facing upward for subsequent operations. In some embodiments, the carrier substrate is temporarily attached to the substrate 101 and will be removed at later operations. In some embodiments, the carrier substrate is a silicon substrate, a glass substrate, or etc.

Figure 16B:
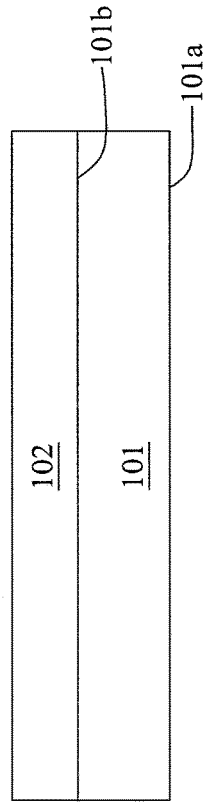
FIG. 16B is a cross-sectional view of a semiconductor structure with a substrate and a barrier layer in accordance with some embodiments of the present disclosure.

In operation 802, a barrier layer 102 is disposed over the second side 101b of the substrate 101 as shown in FIG. 16B. In some embodiments, the barrier layer 102 has similar configuration as in the barrier layer 102 in the semiconductor structure 100 of FIGS. 1 and 2. In some embodiments, the barrier layer 102 includes a first dielectric layer 102a and a second dielectric layer 102b, and the first dielectric layer 102a and the second dielectric layer 102b are disposed over the second side 101b of the substrate 101 to form the barrier layer 102 as shown in FIG. 16C. In some embodiments, the first dielectric layer 102a and the second dielectric layer 102b have similar configuration as in FIG. 3 or 4. In some embodiments, the first dielectric layer 102a is disposed over the substrate 101 and then the second dielectric layer 102b is disposed over the first dielectric layer 102a. In some embodiments, the second dielectric layer 102b is disposed over the substrate 101 and then the first dielectric layer 102a is deposed over the second dielectric layer 102b.

In some embodiments, the barrier layer 102 includes several first dielectric layers 102a and several second dielectric layers 102b as shown in FIG. 16D. In some embodiments, the first dielectric layers 102a and the second dielectric layers 102b are alternately disposed over the second side 101b of the substrate 101. In some embodiments, the first dielectric layer 102a is disposed over the substrate 101 and then the second dielectric layer 102b is disposed over the first dielectric layer 102a. In some embodiments, the second dielectric layer 102b is disposed over the substrate 101 and the first dielectric layer 102a is disposed over the second dielectric layer 102b.

In some embodiments, the first dielectric layer 102a includes oxide or carbide, and the second dielectric layer 102b includes nitride. In some embodiments, the first dielectric layer 102a or the second dielectric layer 102b is formed by oxidation, chemical vapor deposition (CVD) or any other suitable operations.

In operation 803, a grid 104 is disposed over the barrier layer 102 as shown in FIG. 16E. In some embodiments, a metal layer or oxide layer is disposed over the barrier layer 102 by any suitable operations such as CVD, sputtering, etc. to form the grid 104. In some embodiments, the barrier layer 102 is disposed between the grid 104 and the substrate 101.

In operation 804, a first portion of the grid 104 is removed to form a first recess 107 as shown in FIG. 16F. In some embodiments, the first recess 107 is extended through the grid 104. In some embodiments, the barrier layer 102 is disposed between the first recess 107 and the substrate 101.

In some embodiments, the first portion of the grid 104 is removed by photolithography and etching operations. A photo mask is patterned by disposing a photoresist and developing the photoresist by a suitable developer solution. The pattern is then developed according to a position of a color filter to be formed. The photo mask only allows removal of the first portion of the grid 104 at the position of the color filter to be formed. As a result, the first portion of the grid 104 is etched away and the first recess 107 is formed.

In operation 805, a first color filter 103 is disposed within the first recess 107 and interfaced with the barrier layer 102 as shown in FIG. 16G, 16H or 16I. In some embodiments, the first color filter 103 is surrounded by the grid 104. In some embodiments, the first color filter 103 is disposed by spin coating or any other suitable operations. In some embodiments, the first color filter 103 is configured to filter visible light. The first color filter 103 only allows one of primary colors passing through. In some embodiments, the first color filter 103 is a red color filter, a green color filter or a blue color filter. In some embodiments, a micro lens is disposed over the first color filter 103 for focusing and directing the electromagnetic radiation towards a photosensitive diode in the substrate 101. In some embodiments, a semiconductor structure is formed as shown in FIG. 16G, 16H or 16I. The semiconductor structure of FIG. 16G corresponds to the semiconductor structure 100 of FIGS. 1 and 2. The semiconductor structure of FIG. 16I corresponds to the semiconductor structure 300 of FIGS. 3 and 4.

Figure 17:
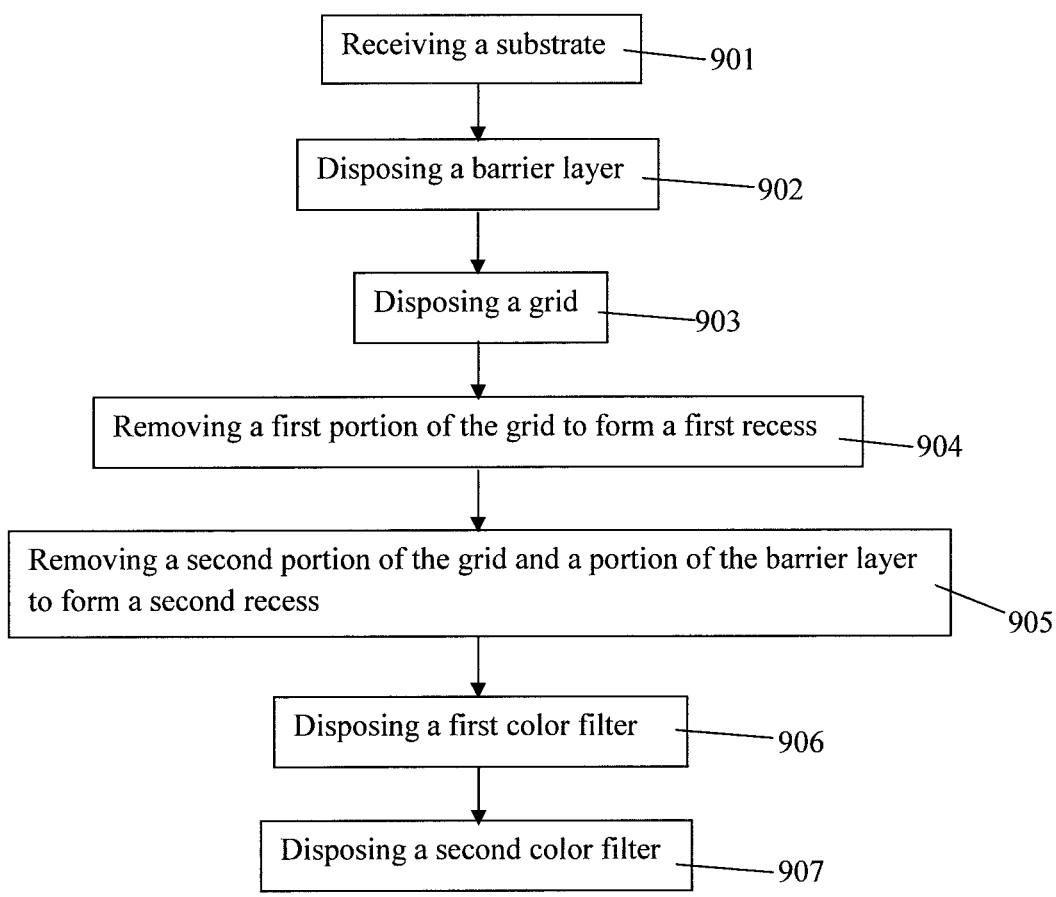
FIG. 17 is a flow diagram of a method of manufacturing a semiconductor structure in accordance with some embodiments of the present disclosure.

FIG. 17 is an embodiment of a method 900 of manufacturing a semiconductor structure. The method 900 includes a number of operations (901, 902, 903, 904, 905, 906 and 907).

Figure 17A:
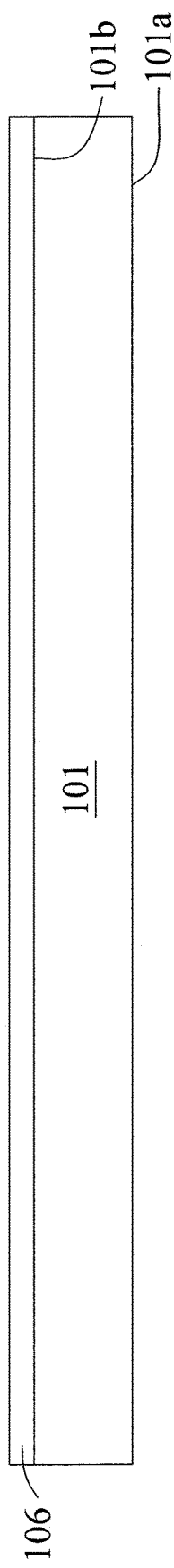
FIG. 17A is a cross-sectional view of a semiconductor structure with a substrate in accordance with some embodiments of the present disclosure.

In operation 901, a substrate 101 is received or provided as shown in FIG. 17A. In some embodiments, the operation 901 is similar to the operation 801. In some embodiments, a high dielectric constant (high k) dielectric layer 106 is disposed over the second side 101b of the substrate 101.

Figure 17B:
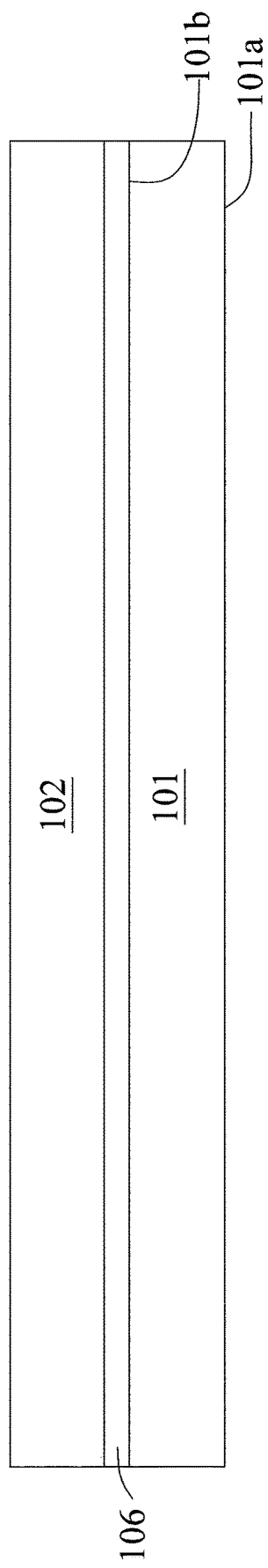
FIG. 17B is a cross-sectional view of a semiconductor structure with a substrate and a barrier layer in accordance with some embodiments of the present disclosure.
Figure 17C:
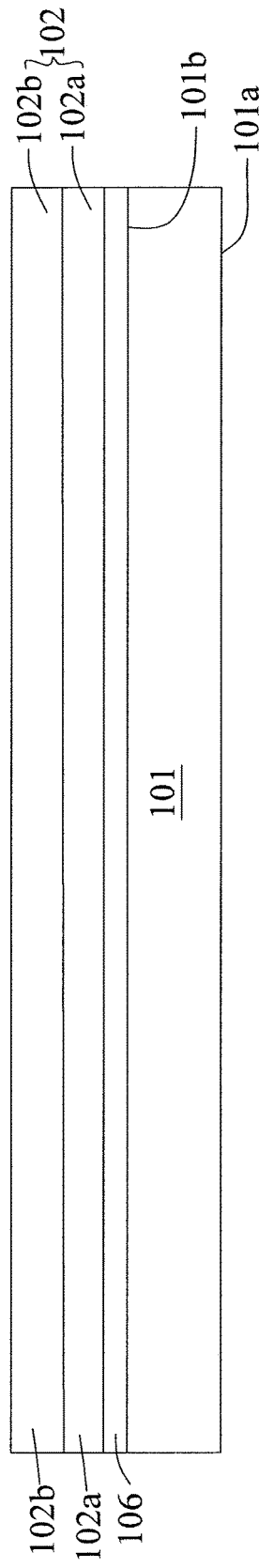
FIG. 17C is a cross-sectional view of a semiconductor structure with a substrate, a first dielectric layer and a second dielectric layer in accordance with some embodiments of the present disclosure.
Figure 17D:
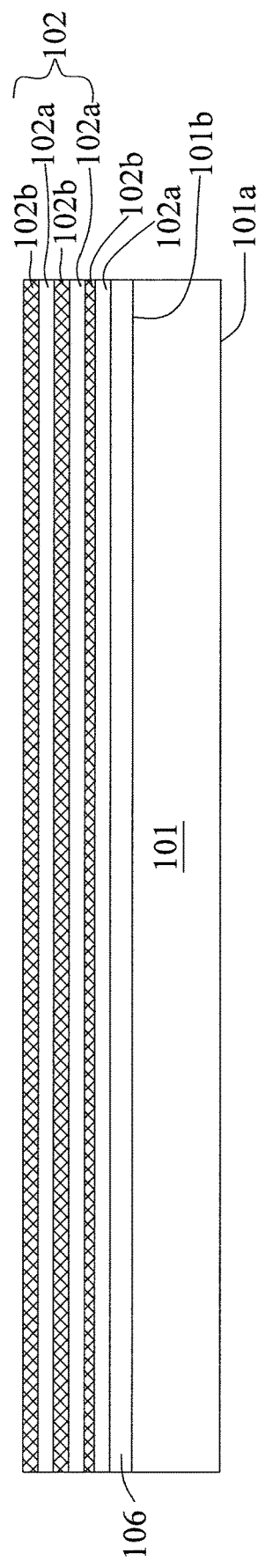
FIG. 17D is a cross-sectional view of a semiconductor structure with a substrate, several first dielectric layers and several second dielectric layers in accordance with some embodiments of the present disclosure.

In operation 902, a barrier layer 102 is disposed over the second side 101b of the substrate 101 as shown in FIG. 17B, 17C or 17D. In some embodiments, the operation 902 is similar to the operation 802. In some embodiments, the barrier layer 102 includes a first dielectric layer 102a and a second dielectric layer 102b as shown in FIG. 17C. In some embodiments, the barrier layer 102 includes several first dielectric layers 102a and several second dielectric layers 102b as shown in FIG. 17D.

Figure 17E:
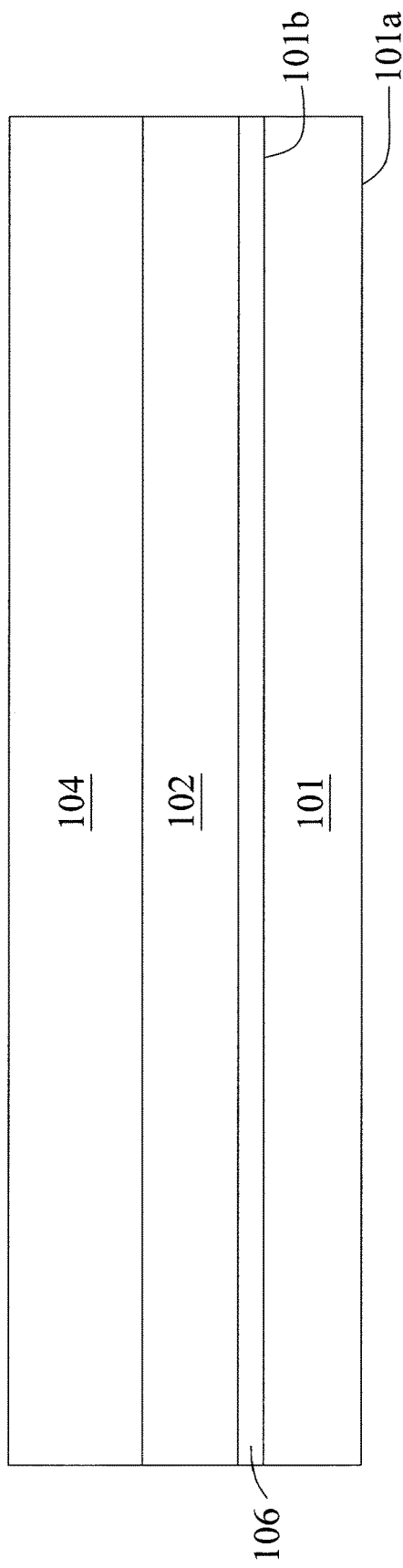
FIG. 17E is a cross-sectional view of a semiconductor structure with a substrate, a barrier layer and a grid in accordance with some embodiments of the present disclosure.

In operation 903, a grid 104 is disposed over the barrier layer 102 as shown in FIG. 17E. In some embodiments, the operation 903 is similar to operation 803. In some embodiments, the barrier layer 102 is disposed between the grid 104 and the substrate 101.

Figure 17F:
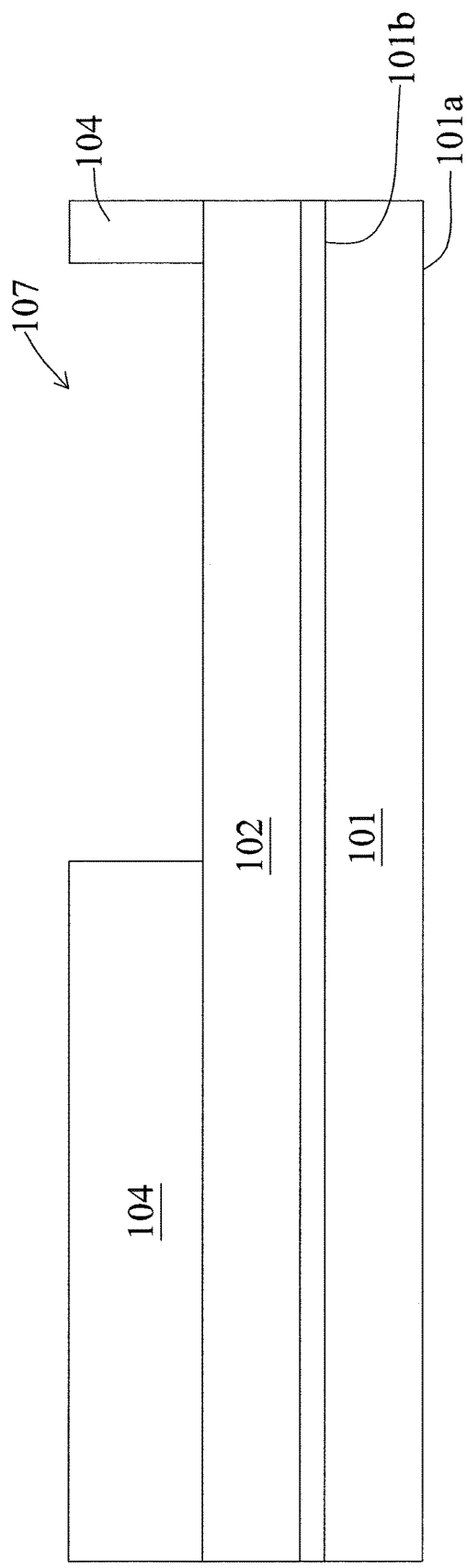
FIG. 17F is a cross-sectional view of a semiconductor structure with a substrate, a barrier layer and a grid with a first recess in accordance with some embodiments of the present disclosure.

In operation 904, a first portion of the grid 104 is removed to form a first recess 107 as shown in FIG. 17F. In some embodiments, the operation 904 is similar to operation 804. In some embodiments, the first recess 107 is formed by photolithography and etching operations.

Figure 17G:
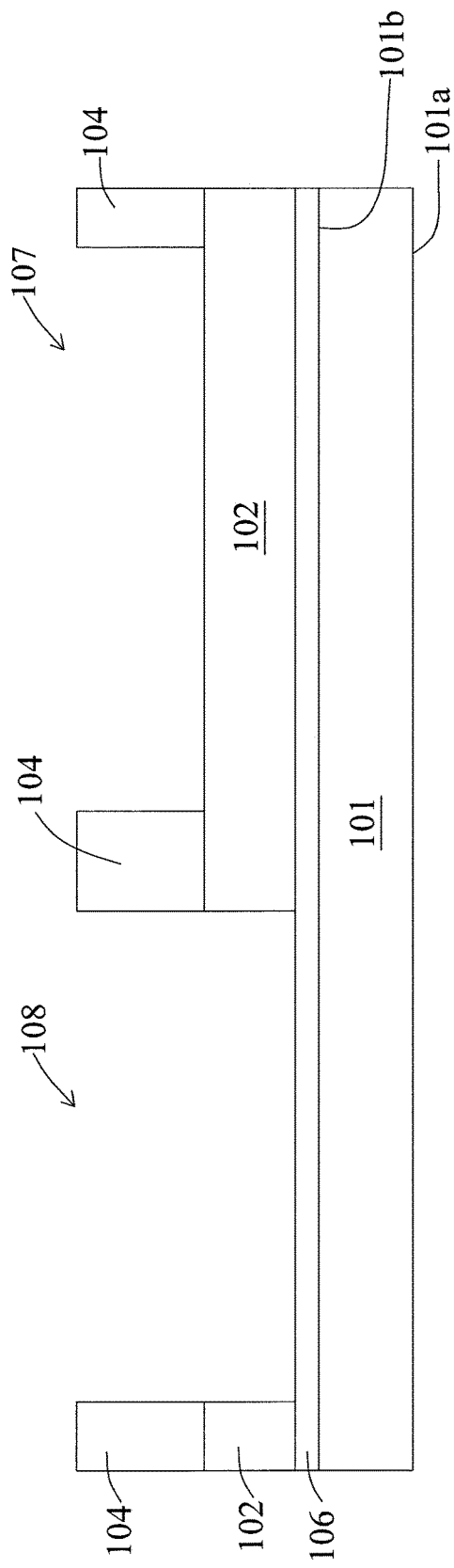
FIG. 17G is a cross-sectional view of a semiconductor structure with a substrate, a barrier layer and a grid with a first recess and a second recess in accordance with some embodiments of the present disclosure.
Figure 17H:
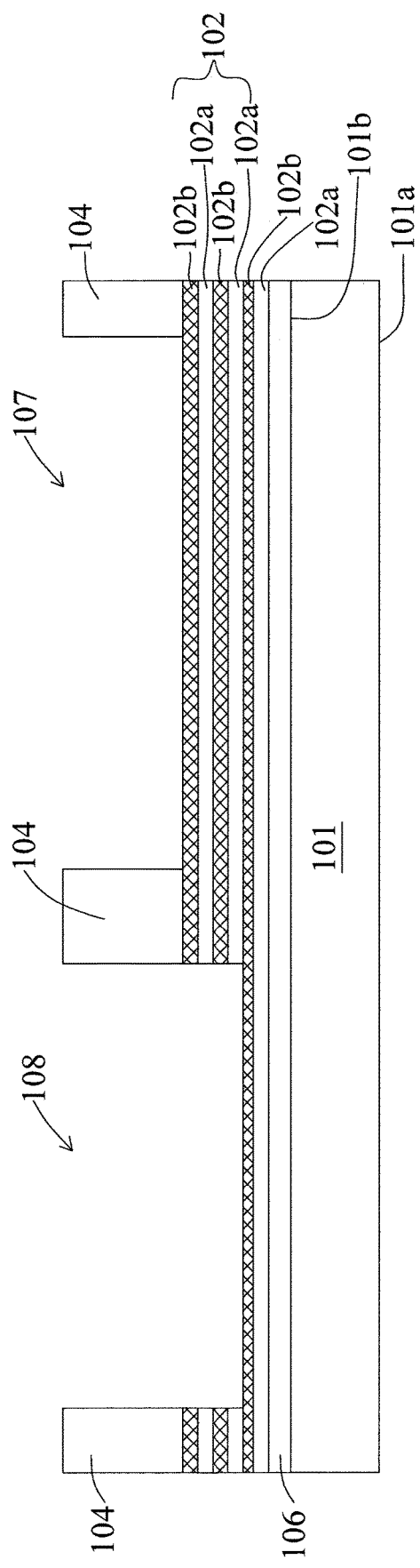
FIG. 17H is a cross-sectional view of a semiconductor structure with a substrate, several first dielectric layers, several second dielectric layers and a grid with a first recess and a second recess in accordance with some embodiments of the present disclosure.

In operation 905, a second portion of the grid 104 and a portion of the barrier layer 102 are removed to form a second recess 108 as shown in FIG. 17G or 17H. In some embodiments, the second recess 108 is formed by photolithography and etching operations, similar to formation of the first recess 107. In some embodiments, the second recess 108 is extended through the grid 104 and barrier layer 102. In some embodiments, the second recess 108 is extended through the grid 104, one or more of the first dielectric layers 102a and one or more of the second dielectric layers 102b. Therefore, the second recess 108 is disposed over one or more of the first dielectric layers 102a or one or more of the second dielectric layers 102b as shown in FIG. 17H. In some embodiments, the second recess 108 is disposed over the substrate 101.

Figure 17I:
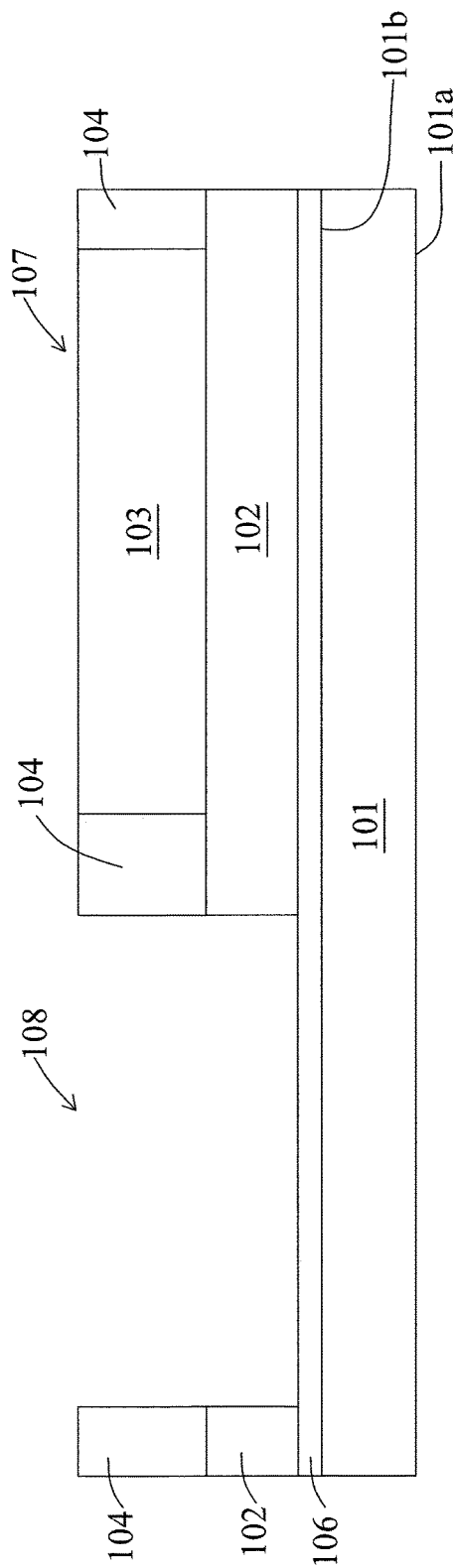
FIG. 17I is a cross-sectional view of a semiconductor structure with a substrate, a barrier layer, a grid and a first color filter in accordance with some embodiments of the present disclosure.

In operation 906, a first color filter 103 is disposed within the first recess 107 as shown in FIG. 17I. In some embodiments, the operation 906 is similar to the operation 805. In some embodiments, the barrier layer 102 is disposed between the first color filter 103 and the substrate 101.

Figure 17J:
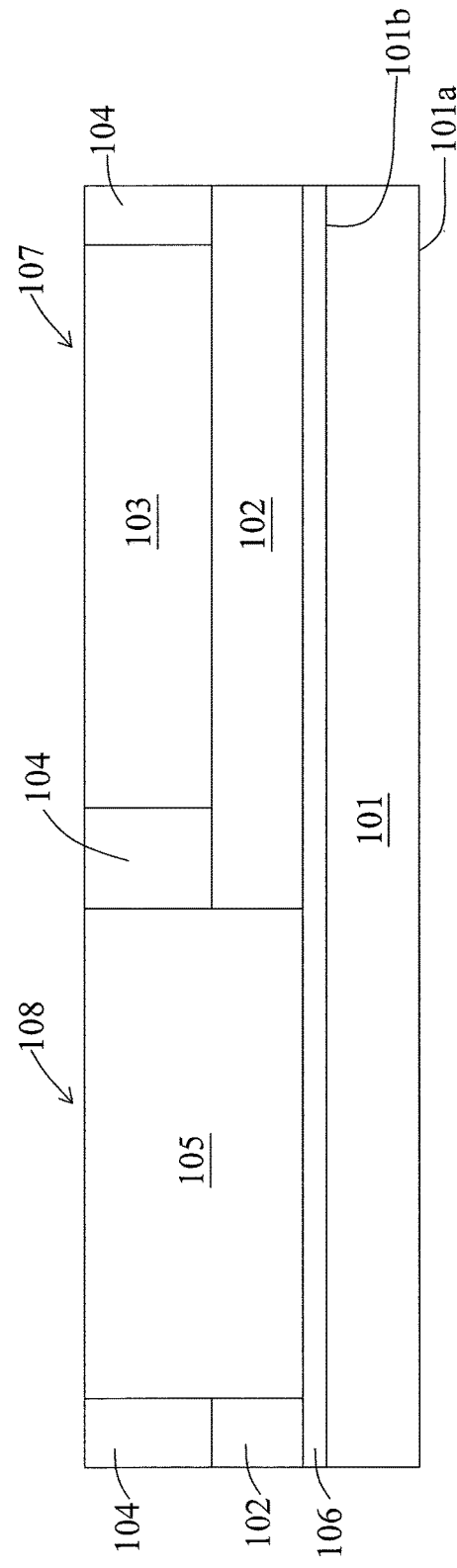
FIG. 17J is a cross-sectional view of a semiconductor structure with a substrate, a barrier layer, a grid, a first color filter and a second color filter in accordance with some embodiments of the present disclosure.

In operation 907, a second color filter 105 is disposed within the second recess 108 as shown in FIG. 17J. In some embodiments, the second color filter 105 is disposed by spin coating or any other suitable operations. In some embodiments, the second color filter 105 is disposed over the substrate 101. In some embodiments, a micro lens is disposed over the second color filter 105. In some embodiments, the second color filter 105 and the first color filter 103 are formed simultaneously. In some embodiments, the second color filter 105 is formed before formation of the first color filter 103.

In some embodiments, the second color filter 105 is configured to filter non-visible light. In some embodiments, the second color filter 105 is IR filter which only allows IR passing through and impinging on the substrate 101. In some embodiments, a semiconductor structure is formed as shown in FIG. 17J, 17K or 17L. The semiconductor structure of FIG. 17J corresponds to the semiconductor structure 300 of FIGS. 5 and 6. The semiconductor structure of FIG. 17K corresponds to the semiconductor structure 400 of FIGS. 7 and 8. The semiconductor structure of FIG. 17L corresponds to the semiconductor structure 500 of FIGS. 9 and 10.

In the present disclosure, an image sensing device with an improved semiconductor structure is disclosed. The semiconductor structure includes a substrate and several color filters. A non-visible light pixel for sensing non-visible light in an electromagnetic radiation incident on the substrate is defined. The color filter allows the non-visible light such as infra-red (IR) passing through and impinging on corresponding photosensitive diode in substrate, so that information of the non-visible light in the electromagnetic radiation can be obtained for subsequent image processing. Furthermore, the semiconductor structure is defined with a visible light pixel adjacent to the non-visible light pixel. A barrier layer is included in the visible light pixel and disposed between the substrate and the color filter. The barrier layer includes several dielectric layers such as nitride, oxide or carbide. The barrier layer prevents the non-visible light such as IR from incident on the photosensitive diode within the visible light pixel.

In some embodiments, a semiconductor structure includes a substrate including a first side and a second side disposed opposite to the first side and configured to receive an electromagnetic radiation, a barrier layer disposed over the second side of the substrate, a color filter disposed over the barrier layer, and a grid surrounding the color filter and disposed over the barrier layer, wherein the barrier layer is configured to absorb or reflect non-visible light in the electromagnetic radiation, and the barrier layer is disposed between the grid and the substrate.

In some embodiments, the non-visible light includes infra-red (IR). In some embodiments, the barrier layer includes nitride. In some embodiments, a thickness of the barrier layer is substantially greater than 0.31 um. In some embodiments, the barrier layer includes a first dielectric layer and a second dielectric layer. In some embodiments, the barrier layer includes a plurality of first dielectric layers and a plurality of second dielectric layers, and the plurality of first dielectric layers and the plurality of second dielectric layers are alternately disposed. In some embodiments, the color filter is configured to allow visible light in the electromagnetic radiation passing through. In some embodiments, a thickness of the substrate is substantially greater than about 3 um. In some embodiments, the substrate includes a photosensitive diode configured to generate a signal in accordance with the intensity or brightness of the electromagnetic radiation impinged on the photosensitive diode.

In some embodiments, a semiconductor structure includes a substrate including a first side and a second side disposed opposite to the first side and configured to receive an electromagnetic radiation, a first dielectric layer disposed over the second side of the substrate, a second dielectric layer disposed over the first dielectric layer and the second side of the substrate, a first color filter disposed over the second side of the substrate and configured to allow visible light in the electromagnetic radiation passing through, and a second color filter disposed over the second side of the substrate and configured to allow infra-red (IR) in the electromagnetic radiation passing through, a grid separating the first color filter from the second color filter and disposed over the first dielectric layer and the second dielectric layer, wherein the first dielectric layer and the second dielectric layer surround the second color filter.

In some embodiments, the first dielectric layer and the second dielectric layer are configured to absorb or reflect the infra-red (IR) in the electromagnetic radiation passed through the first color filter. In some embodiments, the infra-red (IR) in the electromagnetic radiation passes through the second color filter and impinges on the substrate. In some embodiments, the first dielectric layer includes oxide or carbide, and the second dielectric layer includes nitride. In some embodiments, a thickness of the first dielectric layer is substantially greater than 0.06 um. In some embodiments, a thickness of the second dielectric layer is substantially greater than 0.15 um. In some embodiments, the semiconductor structure further includes a high dielectric constant (high K) dielectric layer disposed on the second side of the substrate.

In some embodiments, a method of manufacturing a semiconductor structure includes receiving a substrate including a first side and a second side opposite to the first side, disposing a barrier layer over the second side of the substrate, disposing a grid over the barrier layer, removing a first portion of the grid to form a first recess, and disposing a first color filter within the first recess and interfaced with the barrier layer, wherein the barrier layer is disposed between the grid and the substrate.

In some embodiments, the disposing the barrier layer includes disposing a first dielectric layer and a second dielectric layer. In some embodiments, the disposing the barrier layer includes alternately disposing a plurality of first dielectric layers and a plurality of second dielectric layers. In some embodiments, the method further includes removing a second portion of the grid and a portion of the barrier layer to form a second recess, and disposing a second color filter within the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate including a first side and a second side disposed opposite to the first side and configured to receive an electromagnetic radiation;
   a barrier layer disposed over the second side of the substrate;
   a grid disposed over the barrier layer;
   a first color filter disposed over the barrier layer and laterally surrounded by and contacting the grid;
   a second color filter disposed over the substrate and laterally surrounded by and contacting the grid, the second color filter also laterally surrounded by the barrier layer; and
   a dielectric layer disposed between the barrier layer and the substrate,
   wherein the barrier layer comprises an upper surface overlapping the grid and an entirety of the first color filter and a bottom surface substantially level with a bottom surface of the second color filter, and
   wherein the dielectric layer comprises a first portion overlapping an entirety of a bottom surface of the first color filter and a second portion overlapping an entirety of a bottom surface of the second color filter, wherein non-visible light is allowed to pass from the second color filter to the substrate through the second portion of the dielectric layer.

2. The semiconductor structure of claim 1, wherein the first color filter and the second color filter are configured to allow visible light and non-visible light, respectively, in the electromagnetic radiation to pass through.

3. The semiconductor structure of claim 1, wherein the barrier layer includes nitride and the dielectric layer is formed of a high-k dielectric material.

4. The semiconductor structure of claim 1, wherein the barrier layer defines a boundary of the second color filter.

5. The semiconductor structure of claim 1, wherein the barrier layer includes silicon oxide or silicon carbide.

6. The semiconductor structure of claim 1, wherein the second color filter is disposed over the second side of the substrate.

7. The semiconductor structure of claim 1, wherein the grid comprises an upper surface level with a top surface of the first color filter and a bottom surface facing the barrier layer, and the grid is formed of a same material from the upper surface to the bottom surface of the grid.

8. The semiconductor structure of claim 7, wherein the material of the grid is a metallic material.

9. The semiconductor structure of claim 1, wherein the substrate includes a photosensitive diode configured to generate a signal in accordance with an intensity or brightness of the electromagnetic radiation that impinges on the photosensitive diode, and the dielectric layer is in contact with the substrate and the barrier layer.

* * * * *